(12) United States Patent
Suzuki et al.

(10) Patent No.: US 11,756,633 B2
(45) Date of Patent: Sep. 12, 2023

(54) SEMICONDUCTOR STORAGE DEVICE

(71) Applicant: KIOXIA CORPORATION, Tokyo (JP)

(72) Inventors: Yoshinao Suzuki, Yokohama Kanagawa (JP); Haruka Shibayama, Kamakura Kanagawa (JP)

(73) Assignee: Kioxia Corporation, Tokyo (JP)

( * ) Notice: Subject to any disclaimer, the term of this patent is extended or adjusted under 35 U.S.C. 154(b) by 178 days.

(21) Appl. No.: 17/461,848

(22) Filed: Aug. 30, 2021

(65) Prior Publication Data

US 2022/0238167 A1 Jul. 28, 2022

(30) Foreign Application Priority Data

Jan. 26, 2021 (JP) ................... 2021-010010

(51) Int. Cl.
*G11C 16/16* (2006.01)
*G11C 16/30* (2006.01)
*G11C 16/04* (2006.01)
*G11C 16/26* (2006.01)
*G11C 16/10* (2006.01)

(52) U.S. Cl.
CPC .......... *G11C 16/30* (2013.01); *G11C 16/0483* (2013.01); *G11C 16/10* (2013.01); *G11C 16/16* (2013.01); *G11C 16/26* (2013.01)

(58) Field of Classification Search
CPC .................................................... G11C 16/16
USPC ................ 365/185.29, 185.22, 185.17
See application file for complete search history.

(56) References Cited

U.S. PATENT DOCUMENTS

| 8,351,265 B2 | 1/2013 | Pyeon et al. |
| 10,693,369 B2 | 6/2020 | Ku et al. |
| 2007/0195610 A1* | 8/2007 | Park ............... G11C 16/16 365/185.29 |
| 2014/0029346 A1 | 1/2014 | Tanzawa et al. |
| 2016/0349776 A1 | 12/2016 | Conte et al. |
| 2019/0318789 A1 | 10/2019 | Tang et al. |
| 2019/0369966 A1 | 12/2019 | Hsu |
| 2019/0371414 A1 | 12/2019 | Nguyen et al. |

FOREIGN PATENT DOCUMENTS

| TW | 201403618 A | 1/2014 |
| TW | 202004757 A | 1/2020 |

* cited by examiner

*Primary Examiner* — Jason Lappas
(74) *Attorney, Agent, or Firm* — Kim & Stewart LLP

(57) ABSTRACT

A semiconductor storage device includes a memory cell array and a voltage generation circuit configured to supply voltages of different levels to the memory cell array. The voltage generation circuit includes a first charge pump having a first characteristic and a second charge pump having a second characteristic that is substantially different from the first characteristic, and is controlled to electrically disconnect an output end of the first charge pump and an input end of the second charge pump in a first operation during which a first voltage is supplied to the memory cell array, and to electrically connect the output end of the first charge pump and the input end of the second charge pump in a second operation during which a second voltage higher than the first voltage is supplied to the memory cell array.

20 Claims, 14 Drawing Sheets

SEMICONDUCTOR STORAGE DEVICE

CROSS-REFERENCE TO RELATED APPLICATION(S)

This application is based upon and claims the benefit of priority from Japanese Patent Application No. 2021-010010, filed on Jan. 26, 2021, the entire contents of which are incorporated herein by reference.

FIELD

Embodiments described herein relate generally to a semiconductor storage device.

BACKGROUND

A NAND flash memory that executes operations such as writing, reading, and erasing of data is one example of a semiconductor storage device. The NAND flash memory includes a voltage generation circuit. The voltage generation circuit generates voltages used during operations such as writing, reading, and erasing.

DETAILED DESCRIPTION

Figure 1:
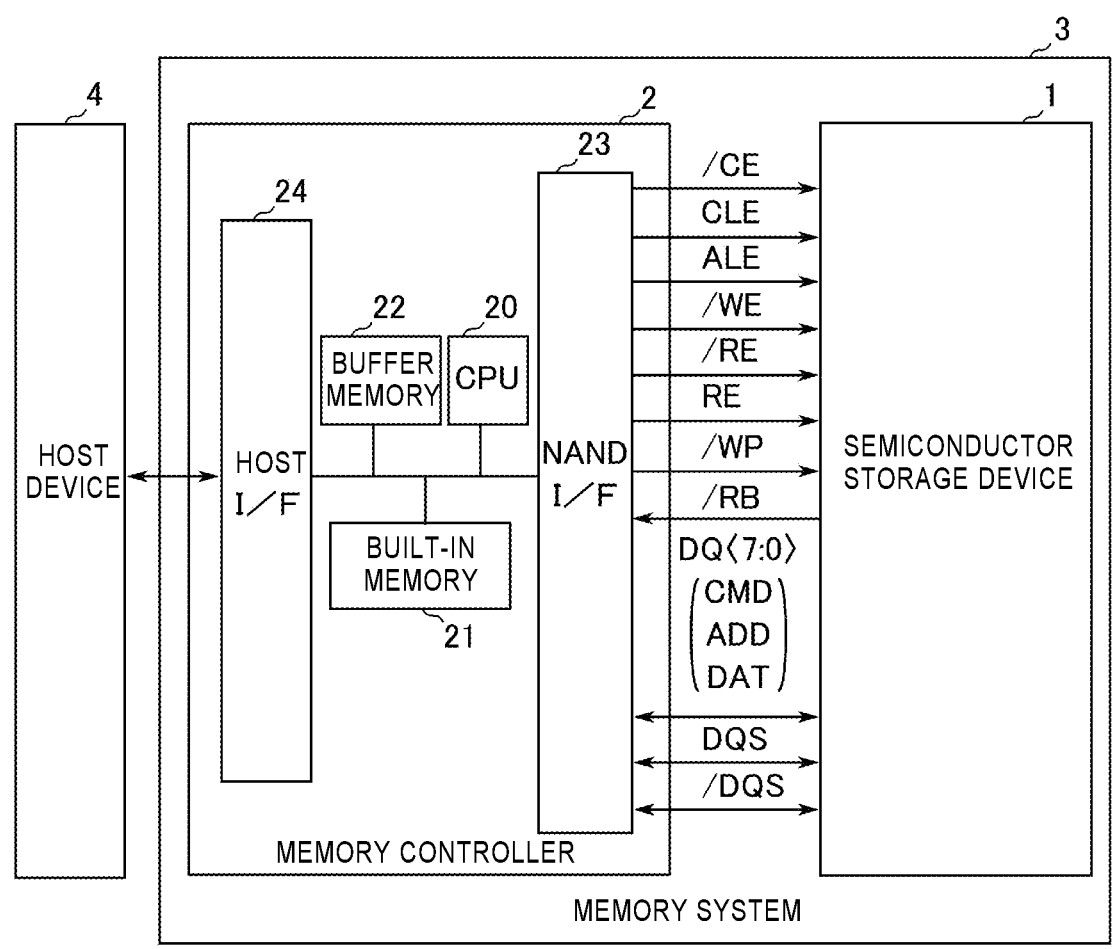
FIG. 1 is a block diagram illustrating an example of a configuration of a host device and a memory system including a semiconductor storage device according to an embodiment.

Embodiments provide a voltage generation circuit having features that prevent an increase in the area of the voltage generation circuit and an increase in the amount of current consumed by the voltage generation circuit.

In general, according to one embodiment, a semiconductor storage device includes a memory cell array and a voltage generation circuit configured to supply voltages of different levels to the memory cell array, the voltage generation circuit including a first charge pump having a first characteristic and a second charge pump having a second characteristic that is substantially different from the first characteristic, each charge pump having an input end and an output end. The voltage generation circuit is controlled to electrically disconnect the output end of the first charge pump and the input end of the second charge pump in a first operation during which a first voltage is supplied to the memory cell array, and to electrically connect the output end of the first charge pump and the input end of the second charge pump in a second operation during which a second voltage higher than the first voltage is supplied to the memory cell array.

Hereinafter, embodiments will be described with reference to the accompanying drawings. In the following description, common reference numerals are given to elements having the same function and configuration.

1. Embodiment

Hereinafter, a semiconductor storage device according to an embodiment will be described. In the following, a NAND flash memory will be described as an example of the semiconductor storage device.

1.1 Configuration

A configuration of a semiconductor storage device according to an embodiment will be described.

1.1.1 Memory System

First, a configuration example of a memory system will be described with reference to FIG. 1. FIG. 1 is a block diagram illustrating an example of a configuration of a host device and a memory system including a semiconductor storage device according to an embodiment.

The memory system 3 communicates with, for example, an external host device 4. The memory system 3 stores data from the host device 4, and also reads the data requested by the host device 4. The memory system 3 is, for example, a solid state drive (SSD) or SD™ card.

The memory system 3 includes a semiconductor storage device 1 and a memory controller 2.

The semiconductor storage device 1 has a plurality of memory cells, and stores data in a non-volatile manner. The semiconductor storage device 1 is connected to the memory controller 2 by a NAND bus.

The NAND bus performs transmission and reception via a separate signal line for each of signals/CE, CLE, ALE, /WE, /RE, RE, /WP, /RB, DQ<7:0>, DQS, and/DQ depending on a NAND interface standard. The signal/CE is a chip enable signal and enables the semiconductor storage device 1. The signal CLE is a command latch enable signal, and notifies the semiconductor storage device 1 that the signal DQ<7:0> flowing into the semiconductor storage device 1 includes a command when the signal CLE is at the "H (High)" level. The signal ALE is an address latch enable signal, and notifies the semiconductor storage device 1 that the signal DQ<7:0> flowing into the semiconductor storage device 1 includes an address when the signal ALE is at the "H" level. The signal/WE is a write enable signal, and instructs the semiconductor storage device 1 to receive the signal DQ<7:0> supplied thereto as an input. For example, the signal/WE instructs the semiconductor storage device 1 to receive the signal DQ<7:0> as an input signal containing a command, address, or data at the rising edge of the signal/WE at a single data rate (SDR). Alternatively, the signal/WE may instruct the semiconductor storage device 1 to receive the signal DQ<7:0> as an input signal containing a command or address at the rising edge of the signal/WE at a double data rate (DDR). The signal/RE is a read enable signal, and instructs the semiconductor storage device 1 to output the signal DQ<7:0>. For example, the signal/RE instructs the semiconductor storage device 1 to output the signal DQ<7:0> as data at the falling edge of the signal/RE at a single data rate. Alternatively, the signal/RE may instruct the semiconductor storage device 1 to output the signal DQ<7:0> as data at the falling edge and rising edge of the signal/RE at a double data rate. The signal RE is a complementary signal of the signal/RE. The signal/WP is a write protect signal, and instructs the semiconductor storage device 1 to prohibit writing and erasing of data. The signal/RB is a ready busy signal, and indicates whether the semiconductor storage device 1 is in a ready state (a state capable of accepting an external command) or in a busy state (a state not accepting an external command). The signal DQ<7:0> is, for example, an 8-bit signal. The signal DQS is a data strobe signal, and is used to control the operation timing of the semiconductor storage device 1 related to the signal DQ<7:0>. For example, the signal DQS instructs the semiconductor storage device 1 to input the signal DQ<7:0> as data at the falling edge and rising edge of the signal DQS at a double data rate. Further, the signal DQS is generated based on the falling edge and rising edge of the signal/RE at a double data rate, and is output, along with the signal DQ<7:0> as data, from the semiconductor storage device 1. The signal/DQS is a complementary signal of the signal DQS.

The signal DQ<7:0> is transmitted and received between the semiconductor storage device 1 and the memory controller 2, and includes a command CMD, an address ADD, and data DAT. The command CMD includes, for example, a command for causing the semiconductor storage device 1 to execute an erase operation (erase command), a command for causing the semiconductor storage device 1 to execute a write operation (write command), and a command for causing the semiconductor storage device 1 to execute a read operation (read command). The data DAT is either read data or write data.

The memory controller 2 receives a command from the host device 4 and controls the semiconductor storage device 1 based on the received command. Specifically, the memory controller 2 writes, in the semiconductor storage device 1, data that is to be written based on the write command received from the host device 4. Further, the memory controller 2 reads, from the semiconductor storage device 1, data that is commanded to be read from the host device 4 based on the read command received from the host device 4, and transmits the data to the host device 4.

Examples of the host device 4 which uses the memory system 3 described above may include a digital camera, a personal computer, and a server in a data center.

1.1.2 Memory Controller

As illustrated in FIG. 1, the memory controller 2 includes a central processing unit 20, a built-in memory 21, a buffer memory 22, a NAND interface circuit (NAND I/F) 23, and a host interface circuit (host I/F) 24. The memory controller 2 is configured as, for example, a system-on-a-chip (SoC).

The CPU 20 controls operations of the entire memory controller 2. The CPU 20 issues, for example, commands to instruct the semiconductor storage device 1 to execute various operations such as a write operation, a read operation, and an erase operation.

The built-in memory 21 is, for example, a semiconductor memory such as a dynamic random access memory (DRAM), and is used as a work area of the CPU 20. The built-in memory 21 stores, for example, firmware for managing the semiconductor storage device 1 and various management tables.

The buffer memory 22 temporarily stores, for example, write data received from the host device 4, or read data received from the semiconductor storage device 1 by the memory controller 2.

The NAND interface circuit 23 is connected to the semiconductor storage device 1 via the NAND bus and takes charge of communication with the semiconductor storage device 1. The NAND interface circuit 23 transmits the command CMD, the address ADD, and the write data to the semiconductor storage device 1 in response to an instruction of the CPU 20. Further, the NAND interface circuit 23 receives the read data from the semiconductor storage device 1.

The host interface circuit 24 is connected to the host device 4 via a host bus and takes charge of communication between the memory controller 2 and the host device 4. The host interface circuit 24 transmits, for example, the command and data received from the host device 4 to the CPU 20 and the buffer memory 22, respectively.

1.1.3 Semiconductor Storage Device

Figure 2:
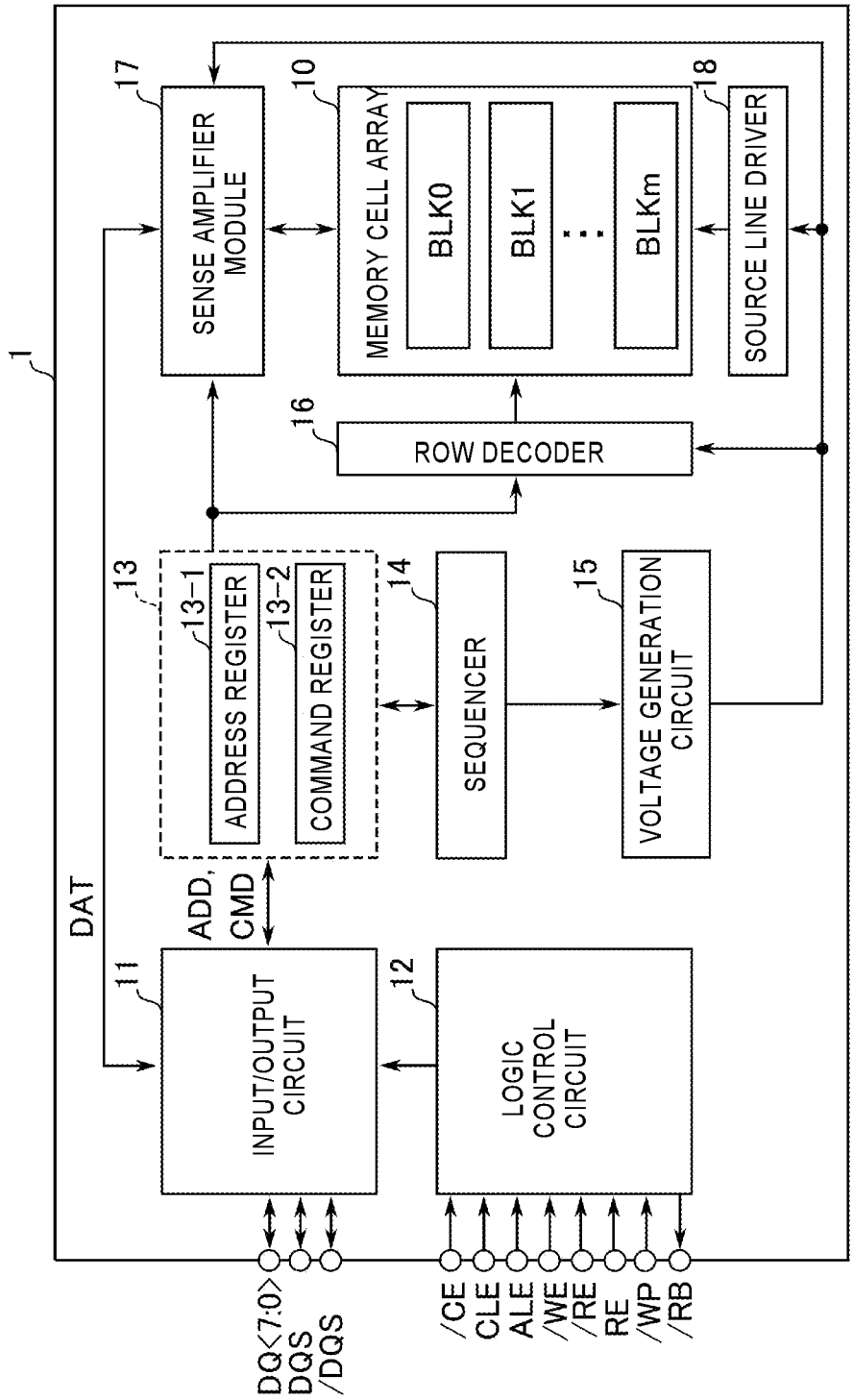
FIG. 2 is a block diagram illustrating an example of a configuration of the semiconductor storage device according to the embodiment.

Next, a configuration example of the semiconductor storage device 1 according to the embodiment will be described with reference to FIG. 2. FIG. 2 is a block diagram illustrating an example of a configuration of the semiconductor storage device 1 according to the embodiment.

The semiconductor storage device 1 includes a memory cell array 10, an input/output circuit 11, a logic control circuit 12, a register 13, a sequencer 14, a voltage generation circuit 15, a row decoder 16, a sense amplifier module 17, and a source line driver 18. The register 13 includes an address register 13-1 and a command register 13-2.

The memory cell array 10 includes a plurality of blocks BLK0 to BLKm (m being an integer of 1 or more). Each block BLK is a set of a plurality of memory cell transistors capable of storing data in a non-volatile manner, and is used, for example, as a unit of data erase. That is, the data stored in the memory cell transistors in the same block BLK are collectively erased. A detailed configuration of the memory cell array 10 will be described later.

The input/output circuit 11 transmits and receives the signal DQ<7:0> to and from the memory controller 2. The input/output circuit 11 transmits the address ADD and the command CMD in the signal DQ<7:0> to the address register 13-1 and the command register 13-2, respectively.

Further, the input/output circuit 11 transmits and receives the data DAT to and from the sense amplifier module 17.

The logic control circuit 12 receives, for example, the signals /CE, CLE, ALE, /WE, /RE, RE, /WP, DQS, and /DQS from the memory controller 2, and controls the input/output circuit 11 based on the received signals. Further, the logic control circuit 12 generates the signal /RB and transmits the signal to the memory controller 2.

The register 13 stores various signals. The address register 13-1 stores the address ADD transmitted from the input/output circuit 11. The address register 13-1 transmits the stored address ADD to the row decoder 16 and the sense amplifier module 17. The command register 13-2 stores the command CMD transmitted from the input/output circuit 11. The command register 13-2 transmits the stored command CMD to the sequencer 14.

The sequencer 14 receives the command CMD from the command register 13-2, and controls the entire semiconductor storage device 1 according to a sequence based on the received command CMD. For example, the sequencer 14 instructs the voltage generation circuit 15 to generate a voltage used in a corresponding operation when receiving the erase command, the write command, and the read command, respectively.

The voltage generation circuit 15 generates a voltage used for the erase operation, the write operation, and the read operation based on an instruction from the sequencer 14, and supplies the generated voltage to the row decoder 16, the sense amplifier module 17, and the source line driver 18.

The row decoder 16 receives a block address in the address ADD from the address register 13-1, and selects any of the blocks BLK0 to BLKm (m being an integer of 1 or more) based on the block address. The row decoder 16 applies the voltage supplied from the voltage generation circuit 15 to, for example, the selected block BLK.

The sense amplifier module 17 receives a column address in the address ADD from the address register 13-1, and transmits the data DAT between the memory controller 2 and the memory cell array 10 based on the column address. More specifically, during the write operation, the sense amplifier module 17 receives the write data from the input/output circuit 11 and transmits the received write data to the memory cell array 10. Further, during the read operation, the sense amplifier module 17 senses a threshold voltage of the memory cell transistor which is a target of the read operation in the memory cell array 10 to generate read data, and transmits the generated read data to the input/output circuit 11.

The source line driver 18 applies the voltage supplied from the voltage generation circuit 15 to the source line of the memory cell array 10.

1.1.4 Memory Cell Array

Figure 3:
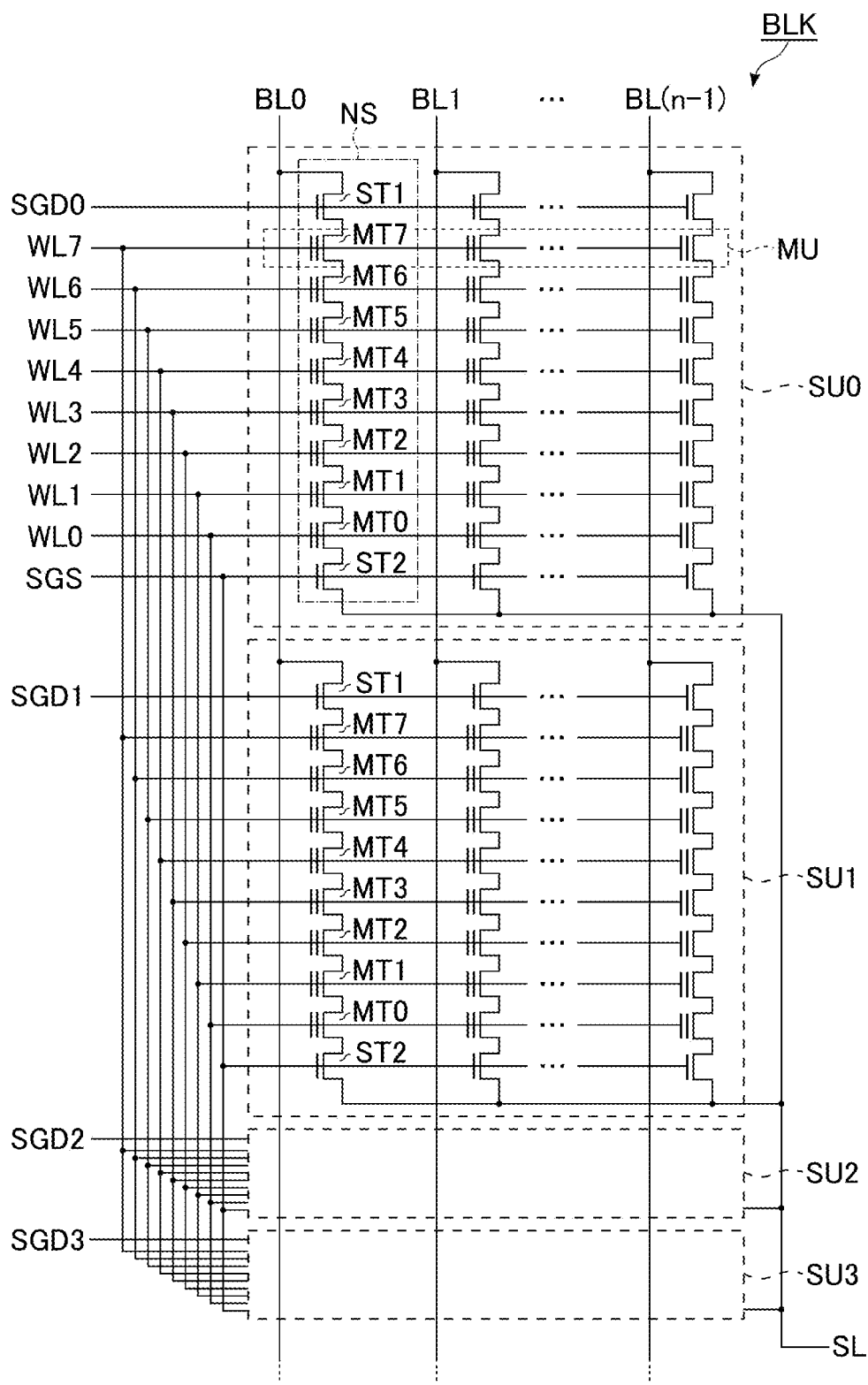
FIG. 3 is a circuit diagram illustrating an example of a configuration of a memory cell array of the semiconductor storage device according to the embodiment.

Next, a configuration of the memory cell array 10 of the semiconductor storage device 1 according to the embodiment will be described with reference to FIG. 3. FIG. 3 is an example of a circuit diagram illustrating a configuration of the memory cell array 10 of the semiconductor storage device 1 according to the embodiment.

The block BLK includes, for example, four string units SU (SU0, SU1, SU2, and SU3). Each string unit SU includes a plurality of NAND strings NS.

Each of the NAND strings NS has, for example, eight memory cell transistors MT (MT0 to MT7) and select transistors ST1 and ST2. In addition, the number of memory cell transistors MT provided in each NAND string NS is not limited to 8, and may be 16, 32, 48, 64, 96, or 128 without being limited thereto. That is, the number of word lines WL in the block BLK is not limited to 8, and may be 16, 32, 48, 64, 96, or 128 without being limited thereto. The memory cell transistor MT has a stacked gate including a control gate and a charge storage layer. Each memory cell transistor MT is connected in series between the select transistors ST1 and ST2.

In a block BLK, gates of the select transistors ST1 of the string units SU0 to SU3 are connected to select gate lines SGD0 to SGD3, respectively. Further, a gate of the select transistor ST2 of the string unit SU in the block BLK is commonly connected to a select gate line SGS. In addition, as for the select gate line SGS, similarly to the select gate line SGD, gates of the select transistors ST2 of the string units SU0 to SU3 may be connected to select gate lines SGS0 to SGS3 (not illustrated), respectively. The control gates of the memory cell transistors MT0 to MT7 in the same block BLK are connected to word lines WL0 to WL7, respectively. That is, the word line WL and the select gate line SGS are commonly connected across the string units SU0 to SU3 in the same block BLK. Meanwhile, the select gate line SGD is connected to one string unit SU in the same block BLK.

Further, among the NAND strings NS arranged in a matrix in the memory cell array 10, the other end of the select transistor ST1 of the NAND string NS in the same row is connected to one of n bit lines BL0 to BL(n−1) (n being an integer of 2 or more). Further, the bit line BL is commonly connected to the NAND string NS in the same row across the plurality of blocks BLK.

Further, the other end of the select transistor ST2 is connected to a source line SL. The source line SL is commonly connected to the plurality of NAND strings NS across the plurality of blocks BLK.

As described above, the erase operation is collectively performed on, for example, the memory cell transistors MT in the same block BLK. Meanwhile, the write operation and the read operation may be collectively performed on a plurality of memory cell transistors MT commonly connected to any word line WL in any string unit SU of any block BLK. A set of memory cell transistors MT sharing the word line WL in one string unit SU is referred to as, for example, a memory cell unit MU. That is, the memory cell unit MU is a set of memory cell transistors MT on which the write operation or the read operation is collectively executed.

The set of 1-bit data stored in each of a plurality of memory cell transistors MT in the memory cell unit MU is defined as a "page". One memory cell transistor MT is capable of storing, for example, 2-bit data. This 2-bit data is referred to as a lower bit and an upper bit. In this case, two pages of data are stored in the memory cell unit MU, a set of lower bits stored in the respective memory cell transistors MT in the memory cell unit MU is referred to as a lower page, and a set of upper bits is referred to as an upper page. In addition, the memory cell transistor MT is not limited to 1 or 2 bits, and may be configured to be capable of storing data of 3 bits or more.

Figure 4A:
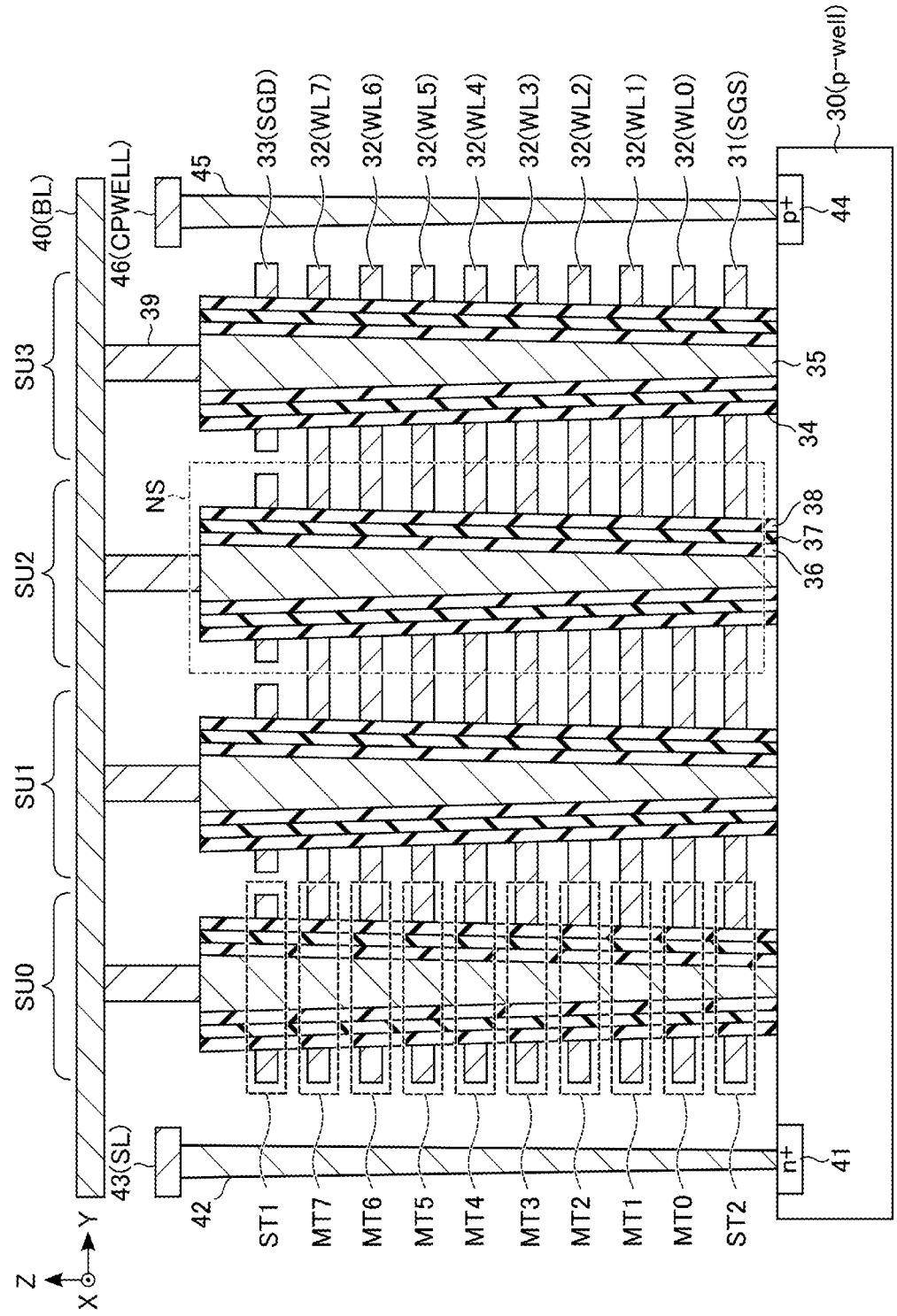
FIG. 4A is a cross-sectional view illustrating an example of a structure of the memory cell array of the semiconductor storage device according to the embodiment.

FIG. 4A is a cross-sectional view of a partial region of the block BLK. In FIG. 4A, the X direction is a direction in which the select gate line extends, the Y direction orthogonal to the X direction in the horizontal plane is a direction in which the bit line extends, and the Z direction is the stacking direction.

A p-type well region (p-well) 30 is provided in a semiconductor layer. A plurality of NAND strings NS is provided on the p-type well region 30. That is, on the p-type well region 30, a wiring layer 31 that functions as the select gate line SGS, eight wiring layers 32 that function as the word lines WL0 to WL7, and a wiring layer 33 that functions as the select gate line SGD are stacked in this order with a plurality of insulating layers interposed therebetween. In order to avoid complicating the drawings, the illustration of the plurality of insulating layers provided among a plurality of the stacked wiring layers is omitted.

A memory hole 34 penetrates the wiring layers 31, 32, and 33 and reaches the p-type well region 30. A pillar-shaped semiconductor layer (semiconductor pillar) 35 is provided in the memory hole 34. A gate insulating film 36, a charge storage layer (in one example, an insulating film) 37, and a block insulating film 38 are sequentially provided on the side surface of the semiconductor pillar 35. These elements constitute the memory cell transistor MT and the select transistors ST1 and ST2. The semiconductor pillar 35 functions as a current path of the NAND string NS, and is a region in which a channel of each transistor is formed. The upper end of the semiconductor pillar 35 is connected to a metal wiring layer 40 that functions as the bit line BL via a contact plug 39.

An $n^+$-type diffusion region 41 into which a high-concentration n-type impurity is introduced is provided in a surface region of the p-type well region 30. A contact plug 42 is provided on the $n^+$-type diffusion region 41. The contact plug 42 is connected to a metal wiring layer 43 that functions as the source line SL. Further, a $p^+$-type diffusion region 44 into which a high-concentration p-type impurity is introduced is provided in the surface region of the p-type well region 30. A contact plug 45 is provided on the $p^+$-type diffusion region 44. The contact plug 45 is connected to a metal wiring layer 46 that functions as a well wiring CPWELL. The well wiring CPWELL is wiring for applying a voltage to the semiconductor pillar 35 via the p-type well region 30.

The string unit SU includes a set of a plurality of NAND strings NS arranged in the X direction in which the components described above are arranged in multiple numbers in the depth direction (X direction) of the paper surface of FIG. 4A.

Figure 4B:
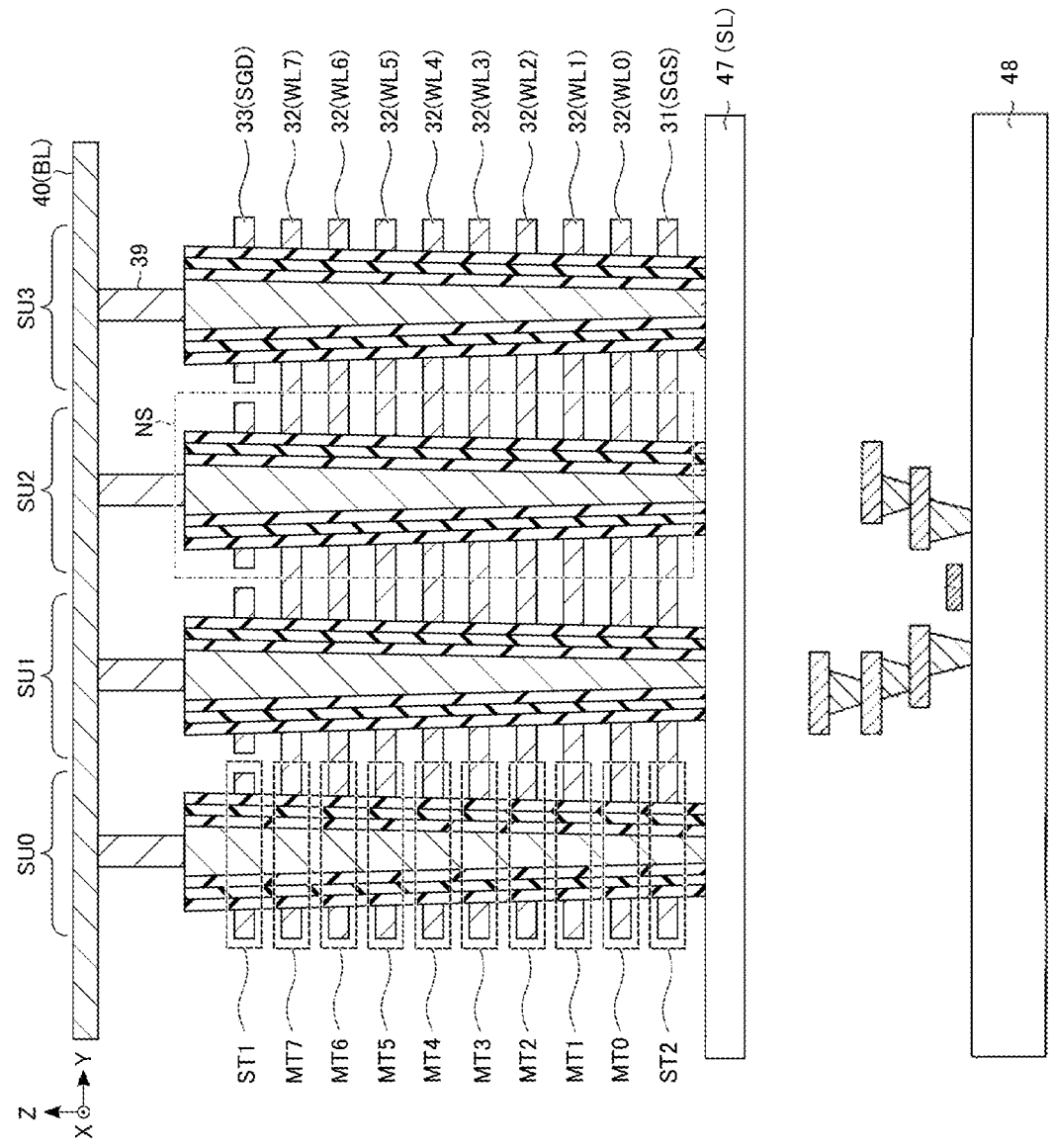
FIG. 4B is a cross-sectional view illustrating another example of a structure of the memory cell array of the semiconductor storage device according to the embodiment.

FIG. 4B is a cross-sectional view of a partial region of a block BLK having another structure. In the structure of FIG. 4B, a wiring layer 47 that functions as the source line SL is provided instead of the p-type well region (p-well) 30, and the plurality of NAND strings NS is provided on the wiring layer 47. The wiring layer 47 and the NAND strings NS are provided over a substrate 48. A transistor for forming a peripheral circuit such as the row decoder 16, the sense amplifier module 17, and the source line driver 18 are formed on the substrate 48. In other words, the transistor for forming the peripheral circuit is formed under the memory cell transistors MT and the select transistors ST1 and ST2.

1.1.5 Configuration of Voltage Generation Circuit

Figure 5:
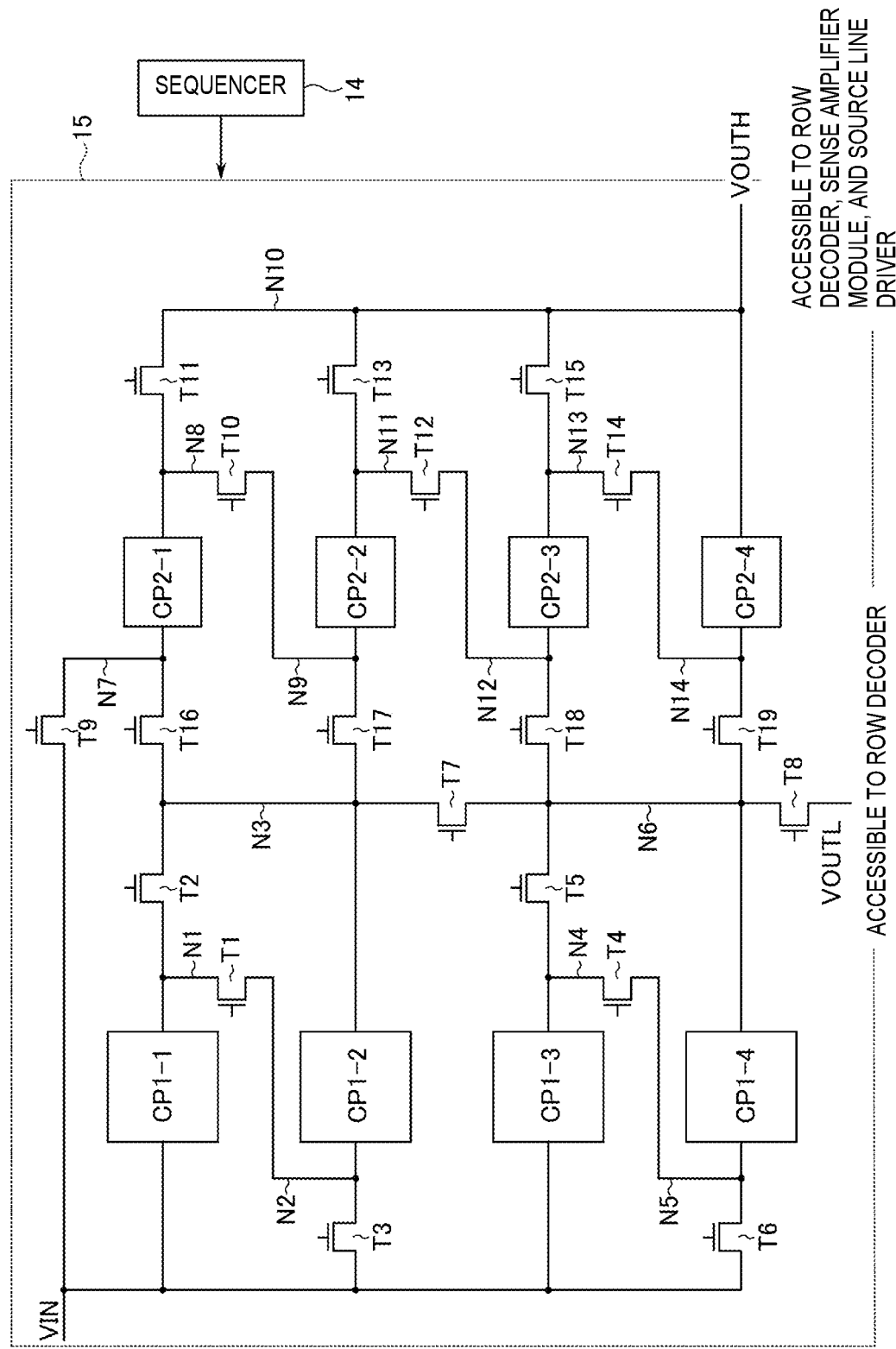
FIG. 5 is a circuit diagram illustrating an example of a configuration of a voltage generation circuit according to the embodiment.

Next, a configuration of the voltage generation circuit 15 of the semiconductor storage device 1 according to the embodiment will be described with reference to FIG. 5. FIG. is a circuit diagram illustrating an example of a configuration of the voltage generation circuit 15 according to the embodiment. In FIG. 5, an example of a configuration of the voltage generation circuit 15 is illustrated along with the sequencer 14.

The voltage generation circuit 15 is configured to output a voltage VOUTL higher than a voltage VIN from a first output end and output a voltage VOUTH higher than the voltage VOUTL from a second output end according to operations such as writing, reading, and erasing of data when the voltage VIN is input. The voltage VIN is, for example, a voltage supplied from a voltage source (not illustrated) inside the semiconductor storage device 1.

The voltage VOUTL includes, for example, voltages VREAD and VPASS. The voltage VREAD is a voltage applied to the word line WL connected to the memory cell transistor MT other than a read target in the read operation. The voltage VPASS is a voltage applied to the word line WL connected to the memory cell transistor MT other than a write target in the write operation.

The voltage VOUTH includes, for example, voltages VPGM and VERA. The voltage VPGM is a voltage applied to the word line WL connected to the memory cell transistor MT serving as a write target in the write operation. The voltage VERA is a voltage applied to the source line SL connected to the block BLK as an erase target in the erase operation.

In the following description, the word line WL connected to the memory cell transistor MT other than the read target and the word line WL connected to the memory cell transistor MT other than the write target are referred to as a non-selected word line WL. Further, the word line WL connected to the memory cell transistor MT as the read target and the word line WL connected to the memory cell transistor MT as the write target are referred to as a selected word line WL.

The voltage generation circuit 15 includes four charge pumps CP1 (CP1-1, CP1-2, CP1-3, and CP1-4), four charge pumps CP2 (CP2-1, CP2-2, CP2-3, and CP2-4), and transistors T1 to T19. The charge pump CP1 is a charge pump having a higher current supply capacity than the charge pump CP2. That is, when outputting a voltage, the charge pump CP1 is configured to be able to output a larger amount of current than the charge pump CP2. In other words, the maximum value of current (maximum output possible current amount) output from an output end of the charge pump CP1 is larger than the maximum output possible current amount of the charge pump CP2. Therefore, when outputting the same voltage, the charge pump CP1 may raise the voltage of a connected wiring to the voltage output from the charge pump P1 more quickly than the charge pump CP2.

Each of the charge pump CP1 and the charge pump CP2 includes an input end and an output end. The charge pump CP1 boosts a voltage input to the input end of the charge pump CP1 and outputs the voltage from the output end of the charge pump CP1. The charge pump CP2 boosts a voltage input to the input end of the charge pump CP2 and outputs the voltage from the output end of the charge pump CP2.

Each of the transistors T1 to T19 is, for example, an N-type transistor.

The voltage VIN is input to the input end of the charge pump CP1-1. The output end of the charge pump CP1-1 is connected to a node N1.

A first end of the transistor T1 is connected to the node N1. A second end of the transistor T1 is connected to a node N2.

A first end of the transistor T2 is connected to the node N1. A second end of the transistor T2 is connected to a node N3.

The voltage VIN is input to a first end of the transistor T3. A second end of the transistor T3 is connected to the node N2.

The input end of the charge pump CP1-2 is connected to the node N2. The output end of the charge pump CP1-2 is connected to the node N3.

The voltage VIN is input to the input end of the charge pump CP1-3. The output end of the charge pump CP1-3 is connected to a node N4.

A first end of the transistor T4 is connected to the node N4. A second end of the transistor T4 is connected to a node N5.

A first end of the transistor T5 is connected to the node N4. A second end of the transistor T5 is connected to a node N6.

The voltage VIN is input to a first end of the transistor T6. A second end of the transistor T6 is connected to the node N5.

The input end of the charge pump CP1-4 is connected to the node N5. The output end of the charge pump CP1-4 is connected to the node N6.

A first end of the transistor T7 is connected to the node N3. A second end of the transistor T7 is connected to the node N6.

A first end of the transistor T8 is connected to the node N6. A second end of the transistor T8 is configured to be connectable to, for example, the row decoder 16. The voltage VOUTL is output from the second end of the transistor T8.

The voltage VIN is input to a first end of a transistor T9. A second end of the transistor T9 is connected to a node N7.

The input end of the charge pump CP2-1 is connected to the node N7. The output end of the charge pump CP2-1 is connected to a node N8.

A first end of the transistor T10 is connected to the node N8. A second end of the transistor T10 is connected to a node N9.

A first end of the transistor T11 is connected to the node N8. A second end of the transistor T11 is connected to a node N10. The node N10 is configured to be connectable to, for example, the row decoder 16, the sense amplifier module 17, and the source line driver 18. The voltage VOUTH is output from the node N10.

The input end of the charge pump CP2-2 is connected to the node N9. The output end of the charge pump CP2-2 is connected to a node N11.

A first end of the transistor T12 is connected to the node N11. A second end of the transistor T12 is connected to a node N12.

A first end of the transistor T13 is connected to the node N11. A second end of the transistor T13 is connected to the node N10.

The input end of the charge pump CP2-3 is connected to the node N12. The output end of the charge pump CP2-3 is connected to a node N13.

A first end of the transistor T14 is connected to the node N13. A second end of the transistor T14 is connected to a node N14.

A first end of the transistor T15 is connected to the node N13. A second end of the transistor T15 is connected to the node N10.

The input end of the charge pump CP2-4 is connected to the node N14. The output end of the charge pump CP2-4 is connected to the node N10.

A first end of the transistor T16 is connected to the node N3. A second end of the transistor T16 is connected to the node N7.

A first end of the transistor T17 is connected to the node N3. A second end of the transistor T17 is connected to the node N9.

A first end of the transistor T18 is connected to the node N6. A second end of the transistor T18 is connected to the node N12.

A first end of the transistor T19 is connected to the node N6. A second end of the transistor T19 is connected to the node N14.

The sequencer 14 is configured to be able to independently control each of the transistors T1 to T19 according to the erase operation, the write operation, and the read operation.

That is, the voltage generation circuit 15 is configured to be able to output the voltages VOUTL and VOUTH depending on the erase operation, the write operation, and the read operation by changing the electrical connections of the charge pumps CP1-1 to CP1-4 and the charge pumps CP2-1 to CP2-4 under the control of the sequencer 14. In addition, in the following description, an operation in which the sequencer 14 controls the transistors T1 to T19 in order to change the electrical connections of the charge pumps CP1-1 to CP1-4 and the charge pumps CP2-1 to CP2-4 is also referred to as a combination operation. The details of the combination operation will be described later.

1.1.6 Configuration of Charge Pump

Descriptions will be made on an example of a configuration of the charge pump CP1 and the charge pump CP2 in the voltage generation circuit 15.

(Charge Pump CP1)

Figure 6:
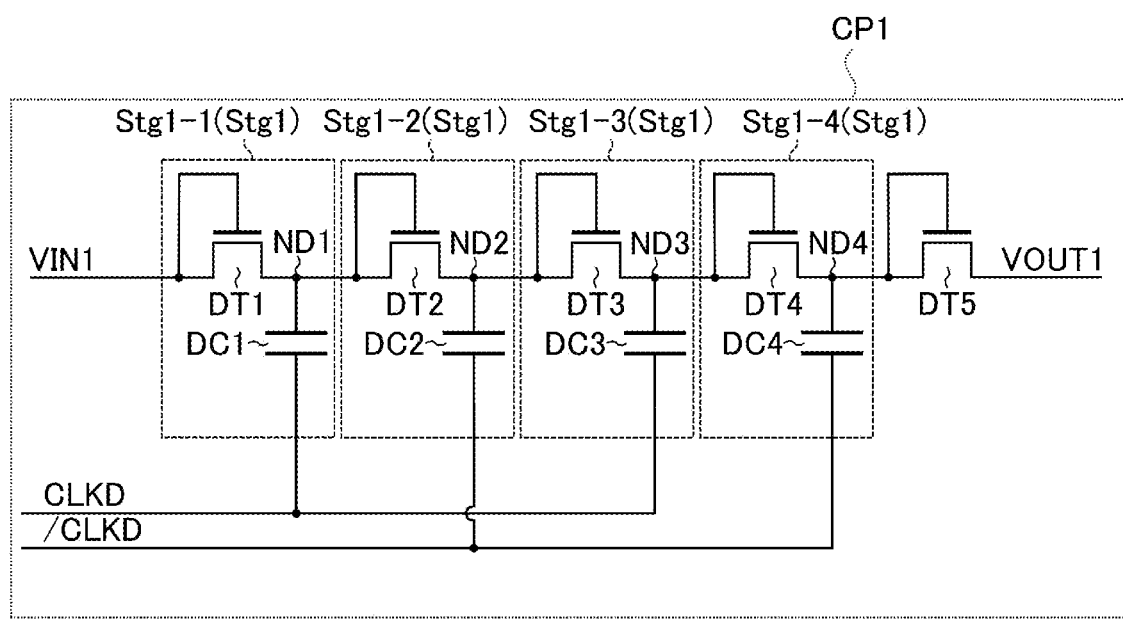
FIG. 6 is a circuit diagram illustrating an example of a configuration of a charge pump in the voltage generation circuit according to the embodiment.

First, a configuration of the charge pump CP1 will be described with reference to FIG. 6. FIG. 6 is a circuit diagram illustrating an example of a configuration of the charge pump CP1 according to the embodiment.

The charge pump CP1 includes, for example, transistors DT (DT1 to DT5) and capacitors DC (DC1 to DC4).

Each of the transistors DT1 to DT5 is, for example, an N-type transistor.

A voltage VIN1 is input to a first end and a gate of the transistor DT1. A second end of the transistor DT1 is connected to a node ND1.

A first end and a gate of the transistor DT2 are connected to the node ND1. A second end of the transistor DT2 is connected to a node ND2.

A first end and a gate of the transistor DT3 are connected to the node ND2. A second end of the transistor DT3 is connected to a node ND3.

A first end and a gate of the transistor DT4 are connected to the node ND3. A second end of the transistor DT4 is connected to a node ND4.

A first end and a gate of the transistor DT5 are connected to the node ND4. A voltage VOUT1 higher than the voltage VIN1 is output from a second end of the transistor DT5.

A first end of the capacitor DC1 is connected to the node ND1. A clock signal CLKD is input to a second end of the capacitor DC1.

A first end of the capacitor DC2 is connected to the node ND2. A clock signal /CLKD is input to a second end of the capacitor DC2.

A first end of the capacitor DC3 is connected to the node ND3. The clock signal CLKD is input to a second end of the capacitor DC3.

A first end of the capacitor DC4 is connected to the node ND4. The clock signal /CLKD is input to a second end of the capacitor DC4.

The clock signal /CLKD is, for example, an inverted signal of the clock signal CLKD. While the clock signal CLKD is at the "H" level, the nodes ND1 and ND3 (i.e., the first end of the capacitor DC1 and the first end of the capacitor DC3) are boosted. While the clock signal /CLKD is at the "H" level, the nodes ND2 and ND4 (i.e., the first end of the capacitor DC2 and the first end of the capacitor DC4) are boosted.

In the charge pump CP1 described above, a configuration including one transistor DTi (i being an integer of 1 or more and 4 or less) and one capacitor DCi is referred to as a stage Stg1 (Stg1-1 to Stg1-4). In the stage Stg1-$i$, the voltage at the second end of the transistor DT$i$ rises by the charging of the capacitor DC$i$. Thus, when i is an integer of 1 or more and 3 or less, the voltage at the first end of the transistor DT(i+1) in the next stage Stg1-(i+1) rises. Further, when i is 4, the voltage at the first end of the transistor DT5 rises to a voltage (VOUT1+Vth) obtained by adding the voltage VOUT1 and the threshold voltage Vth of the transistor DT5. In this way, the stage Stg1 functions as a structural unit that boosts the voltage input to the charge pump CP1.

The voltage VOUT1 dropped by the influence of the threshold voltage Vth of the transistor DT5 is output from the second end of the transistor DT5.

In addition, the charge pump CP1 according to the embodiment includes four stages Stg1-1 to Stg1-4. It is noted that the number of stages Stg1 in the charge pump CP1 according to the embodiment is not limited to this. The number of stages Stg1 may be 2, 3, or 5 or more, and may be changed according to a target value of the voltage to be boosted. In this case, for example, the clock signal CLKD is input to the second end of the capacitor DC$i_a$ (i$a$ being an odd number of 1 or more). Further, for example, the clock signal /CLKD is input to the second end of the capacitor DC$i_b$ (i$b$ being an even number of 2 or more).

In the charge pump CP1 having the above configuration, a boost gain VOUT1/VIN1 may vary according to the height of the voltage VIN1 input to the charge pump CP1. For example, the boost gain VOUT1/VIN1 of the charge pump CP1 may be lowered as the voltage VIN1 input to the charge pump CP1 becomes higher.

More specifically, in each stage Stg1 of the charge pump CP1, a voltage drop occurs by the threshold voltage of the transistor DT$i$. Thus, when the number of stages Stg1 of the charge pump CP1 is increased in order to raise the voltage VOUT1, the influence of the voltage drop by the threshold voltage of the transistor DT$i$ becomes larger due to an increase in the number of transistors DT$i$.

Further, for example, as the voltage at the second end of the transistor DT$i$ of the charge pump CP1 becomes higher, the threshold voltage of each transistor DT$i$ becomes higher by the substrate bias effect. Thus, when the voltage VOUT1 is set to a high voltage, the influence of the voltage drop by the threshold voltage of each transistor DT$i$ becomes larger.

From the above, on the high voltage side, the influence of the voltage drop by the threshold voltage of the transistor DT$i$ becomes larger, which makes it difficult for the charge pump CP1 to output, for example, a voltage higher than the voltage VOUTL. That is, for example, the boost gain VOUT1/VIN1 of the charge pump CP1 may be significantly lowered when the voltage VOUT1 becomes higher than the voltage VOUTL, so that it becomes difficult to implement an efficient voltage generation.

(Charge Pump CP2)

Figure 7:
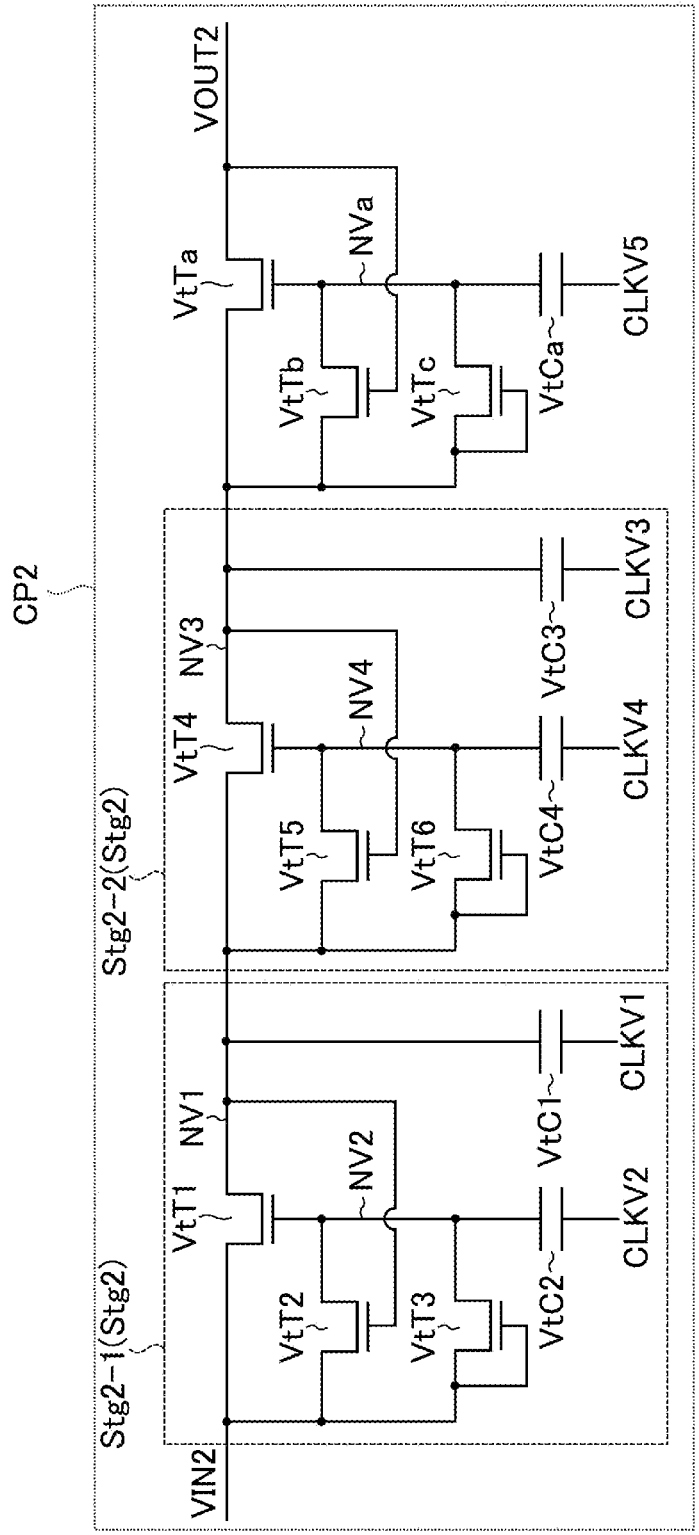
FIG. 7 is a circuit diagram illustrating an example of a configuration of the charge pump in the voltage generation circuit according to the embodiment.

Next, a configuration of the charge pump CP2 will be described with reference to FIG. 7. FIG. 7 is a circuit diagram illustrating an example of a configuration of the charge pump CP2 according to the embodiment.

The charge pump CP2 includes, for example, transistors VtT (i.e., VtT1 to VtT6 and VtTa to VtTc) and capacitors VtC (i.e., VtC1 to VtC4 and VtCa).

Each of the transistors VtT1 to VtT6 and VtTa to VtTc is, for example, an N-type transistor.

A voltage VIN2 is input to a first end of the transistor VtT1. A second end of the transistor VtT1 is connected to a node NV1. A gate of the transistor VtT1 is connected to a node NV2.

The voltage VIN2 is input to a first end of the transistor VtT2. A second end of the transistor VtT2 is connected to the node NV2. A gate of the transistor VtT2 is connected to the node NV1.

The voltage VIN2 is input to a first end and a gate of the transistor VtT3. A second end of the transistor VtT3 is connected to the node NV2.

A first end of the capacitor VtC1 is connected to the node NV1. A clock signal CLKV1 is input to a second end of the capacitor VtC1.

A first end of the capacitor VtC2 is connected to the node NV2. A clock signal CLKV2 is input to a second end of the capacitor VtC2.

A first end of the transistor VtT4 is connected to the node NV1. A second end of the transistor VtT4 is connected to a node NV3. A gate of the transistor VtT4 is connected to a node NV4.

A first end of the transistor VtT5 is connected to the node NV1. A second end of the transistor VtT5 is connected to the node NV4. A gate of the transistor VtT5 is connected to the node NV3.

A first end and a gate of the transistor VtT6 are connected to the node NV1. A second end of the transistor VtT6 is connected to the node NV4.

A first end of the capacitor VtC3 is connected to the node NV3. A clock signal CLKV3 is input to a second end of the capacitor VtC3.

A first end of the capacitor VtC4 is connected to the node NV4. A clock signal CLKV4 is input to a second end of the capacitor VtC4.

A first end of the transistor VtTa is connected to the node NV3. A voltage VOUT2 higher than the voltage VIN2 is output from a second end of the transistor VtTa. A gate of the transistor VtTa is connected to a node NVa.

A first end of the transistor VtTb is connected to the node NV3. A second end of the transistor VtTb is connected to the node NVa. A gate of the transistor VtTb is connected to the second end of the transistor VtTa.

A first end and a gate of the transistor VtTc are connected to the node NV3. A second end of the transistor VtTc is connected to the node NVa.

A first end of the capacitor VtCa is connected to the node NVa. A clock signal CLKV5 is input to a second end of the capacitor VtCa.

The clock signal CLKV3 is, for example, an inverted signal of the clock signal CLKV1. The clock signal CLKV4 is a signal that becomes the "H" level only for a period shorter than the clock cycle of the clock signal CLKV1 for the period during which the clock signal CLKV1 is at the "H" level. The clock signal CLKV5 is a signal that becomes the "H" level only for a period shorter than the clock cycle of the clock signal CLKV3 for the period during which the clock signal CLKV3 is at the "H" level. The clock signal CLKV2 is the same signal as, for example, the clock signal CLKV5. While the clock signal CLKV1 is at the "H" level, the first end (node NV1) of the capacitor VtC1 is boosted. While the clock signal CLKV2 is at the "H" level, the first end (node NV2) of the capacitor VtC2 is boosted. While the clock signal CLKV3 is at the "H" level, the first end (node NV3) of the capacitor VtC3 is boosted. While the clock signal CLKV4 is at the "H" level, the first end (node NV4) of the capacitor VtC4 is boosted. While the clock signal CLKV5 is at the "H" level, the first end (node NVa) of the capacitor VtCa is boosted.

In the charge pump CP2 described above, a configuration including three transistors VtT (3j−2), VtT (3j−1), and VtT(3j) (j being 1 or 2) and two capacitors VtC(2j−1) and VtC(2j) is referred to as a stage Stg2 (Stg2-1 and Stg2-2). In the stage Stg2-j, the charge (voltage) at the first end of the boosted capacitor VtC(2j−1) is transmitted to a node NV(2j+1) via the transistor VtT (3j+1) of the next stage Stg2-(j+1) as the first end of the capacitor VtC (2 (j+1)) of the next stage Stg2-(j+1) is boosted. Further, in the stage Stg2-1, the voltage VIN2 input to the first end of each of the transistors VtT1, VtT2, and VtT3 is transmitted to the node NV1 via the transistor VtT1 as the first end of the capacitor VtC2 is boosted. Further, in the stage Stg2-2, the charge (voltage VOUT2) at the boosted first end of the capacitor VtC3 is output from the charge pump CP2 via the transistor VtTa as the first end of the capacitor VtCa is boosted. Here, unlike the charge pump CP1, the influence of the voltage drop by the threshold voltage of each of the transistors VtT(3j+1), VtT1, and VtTa may be substantially ignored. In this way, the stage Stg2 functions as the structural unit that boosts the voltage input to the charge pump CP2.

The voltage VOUT2 at the first end of the transistor VtTa boosted as described above is output from the second end of the transistor VtTa as the first end of the capacitor VtCa is boosted.

In addition, the charge pump CP2 according to the embodiment includes two stages Stg2. It is noted that the number of stages Stg2 in the charge pump CP2 according to the embodiment is not limited to this. The number of stages Stg2 may be 3 or more, and may be changed according to, for example, a target value of the voltage to be boosted. In this case, for example, the clock signal CLKV1 is input to the second end of the capacitor VtC(2ja−1) (ja being an odd number of 1 or more). Further, for example, the clock signal CLKV2 is input to the second end of the capacitor VtC(2ja). Further, for example, the clock signal CLKV3 is input to the second end of the capacitor VtC (2jb−1) (jb being an even number of 2 or more). Further, for example, the clock signal CLKV4 is input to the second end of the capacitor VtC(2jb).

Unlike the charge pump CP1, as described above, the charge pump CP2 having the above configuration may ignore the influence of the voltage drop by the threshold voltage of the transistor. Thus, for example, even when outputting the voltage VOUT2 higher than the voltage VOUTL, the charge pump CP2 may efficiently boost the voltage to output the voltage VOUT2 higher than the voltage VOUT1 of the charge pump CP1. For example, the boost gain VOUT2/VIN2 of the charge pump CP2 when the height of the voltage VOUT2 output from the charge pump CP2 is higher than the voltage VOUTL is larger than the boost gain VOUT1/VIN1 of the charge pump CP1 when the height of the voltage VOUT1 output from the charge pump CP1 is higher than the voltage VOUTL.

As described above, the charge pump CP1 has a high current supply capacity at a low voltage due to a simple configuration of the charge pump CP1, but has a small boost gain at a high voltage due to the influence of the voltage drop by the threshold voltage of the transistor CT of each stage Stg1. Meanwhile, the charge pump CP2 has a low current supply capacity by having a more complicated circuit configuration than the charge pump CP1, but has a large boost gain even at a high voltage since the influence of the voltage drop by the threshold voltage of the transistor may be significantly ignored. The voltage generation circuit 15 may efficiently generate voltages required for various operations by combining charge pumps of two different types and having different characteristics, namely charge pump CP1 and charge pump CP2, in this way.

1.2 Operation

Next, an operation using the semiconductor storage device 1 according to the present embodiment will be described. In the following, examples of each of the erase operation, the write operation, and the read operation will be described.

In addition, in the following description, the word line WL and the string unit SU corresponding to the memory cell transistor MT which is a target of the write operation or the read operation are referred to as a selected word line WL and a selected string unit SU, respectively. Further, the word line WL and the string unit SU corresponding to the memory cell transistor MT which is not the target of the write operation or the read operation are referred to as a non-selected word line WL and a non-selected string unit SU, respectively.

Here, when the number of word lines WL in the block BLK is n (e.g., 8, 16, 32, 48, 64, 96, or 128), the number of selected word lines is 1 and the number of non-selected word lines is n−1 in the write operation or the read operation.

1.2.1 Erase Operation

First, an example of the erase operation according to the present embodiment will be described. The erase operation includes an operation of applying a voltage to the source line SL and the bit line BL (hereinafter, also referred to as an erase voltage applying operation) in order to lower the threshold voltage of the memory cell transistor MT, and an erase verification operation of determining whether the threshold voltage of the memory cell transistor MT becomes lower than a target voltage by the erase voltage applying operation. The semiconductor storage device 1 sets the threshold voltage of the memory cell transistor MT to be less than the target voltage by repeating a combination of the erase voltage applying operation and the erase verification operation.

Further, in the following description, the description related to the erase verification operation will be omitted, and an example of a case where the erase voltage applying operation is executed once and the voltage supplied by the voltage generation circuit 15 during the erase voltage applying operation will be mainly explained.

1.2.1.1 Voltage of Each Wiring During Erase Voltage Applying Operation

Figure 8:
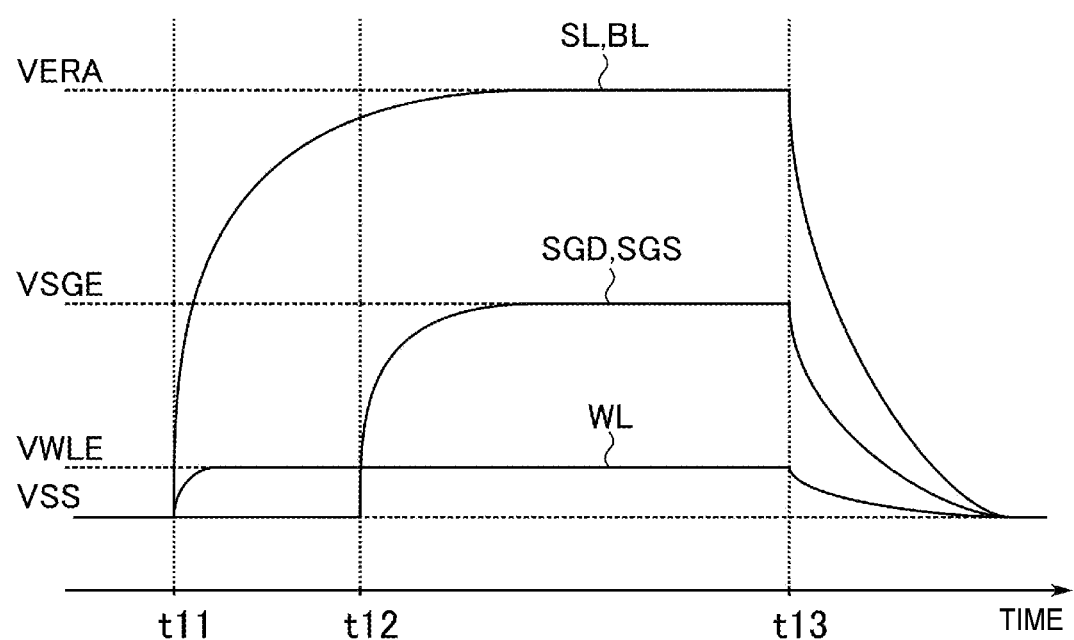
FIG. 8 is a timing chart illustrating an example of voltages of a bit line, a word line, a source line, and a select gate line during an erase voltage applying operation in an erase operation using the semiconductor storage device according to the embodiment.

With reference to FIG. 8, descriptions will be made on an example of the erase voltage applying operation according to the present embodiment. FIG. 8 is a timing chart illustrating an example of the voltage of each wiring during the erase voltage applying operation.

At time t11, the source line driver 18 applies a voltage VERA to the source line SL.

Further, the sense amplifier module 17 applies the voltage VERA to the bit line BL in the block BLK which is a target of the erase operation.

Further, the row decoder 16 applies a voltage VWLE to the word line WL in the block BLK which is the target of the erase operation. The voltage VWLE is, for example, a voltage equal to or higher than a voltage VSS and lower than the voltage VERA. However, the voltage VWLE is not limited to this, and may be a voltage lower than the voltage VSS.

At time t12, the row decoder 16 applies a voltage VSGE to the select gate lines SGS and SGD of the block BLK which is the target of the erase operation. The voltage VSGE is a voltage higher than the voltage VWLE and lower than the voltage VERA.

By this operation, electron-hole pairs are generated by gate-induced drain leakage (GIDL) in each of the select transistors ST1 and ST2 in the block BLK which is the target of the erase operation.

More specifically, on the select transistor ST1 side of the NAND string NS, a GIDL current (hereinafter, also referred to as a BL side GIDL current) flows from the bit line BL toward the select transistor ST1 by the voltage VERA applied to the bit line BL. Further, on the select transistor ST2 side of the NAND string NS, a GIDL current (hereinafter, also referred to as an SL side GIDL current) flows from the source line SL toward the select transistor ST2. Due to the GIDL current, electrons of the generated electron-hole pairs move to the source line SL and the bit line BL out of a channel of the NAND string NS, and holes move into the channel of the NAND string NS.

The semiconductor storage device 1 raises the voltage in the channel by the holes generated in the channel of the NAND string NS as described above, and injects the holes into the charge storage layer. The semiconductor storage device 1 eliminate the electrons trapped in the charge storage layer of the memory cell transistor MT of the NAND string by combining the injected holes with any electrons previously injected into the charge storage layer of the memory cell transistor MT by the write operation. Thus, the threshold voltage of the memory cell transistor MT of the NAND string is lowered.

At time t13, the row decoder 16 applies the voltage VSS to the word line WL and the select gate lines SGS and SGD.

Further, the sense amplifier module 17 applies the voltage VSS to the bit line BL.

Further, the source line driver 18 applies the voltage VSS to the source line SL.

With the above, the erase voltage applying operation is terminated.

In addition, descriptions have been made on a case where the voltage VSGE is applied to the select gate lines SGS and SGD at time t12. It is noted that the present disclosure is not limited to this. The voltages applied to the respective select gate lines SGS and SGD may be voltages that allow the GIDL current to flow, and may be different voltages.

1.2.1.2 Combination Operation in Erase Voltage Applying Operation

Figure 9:
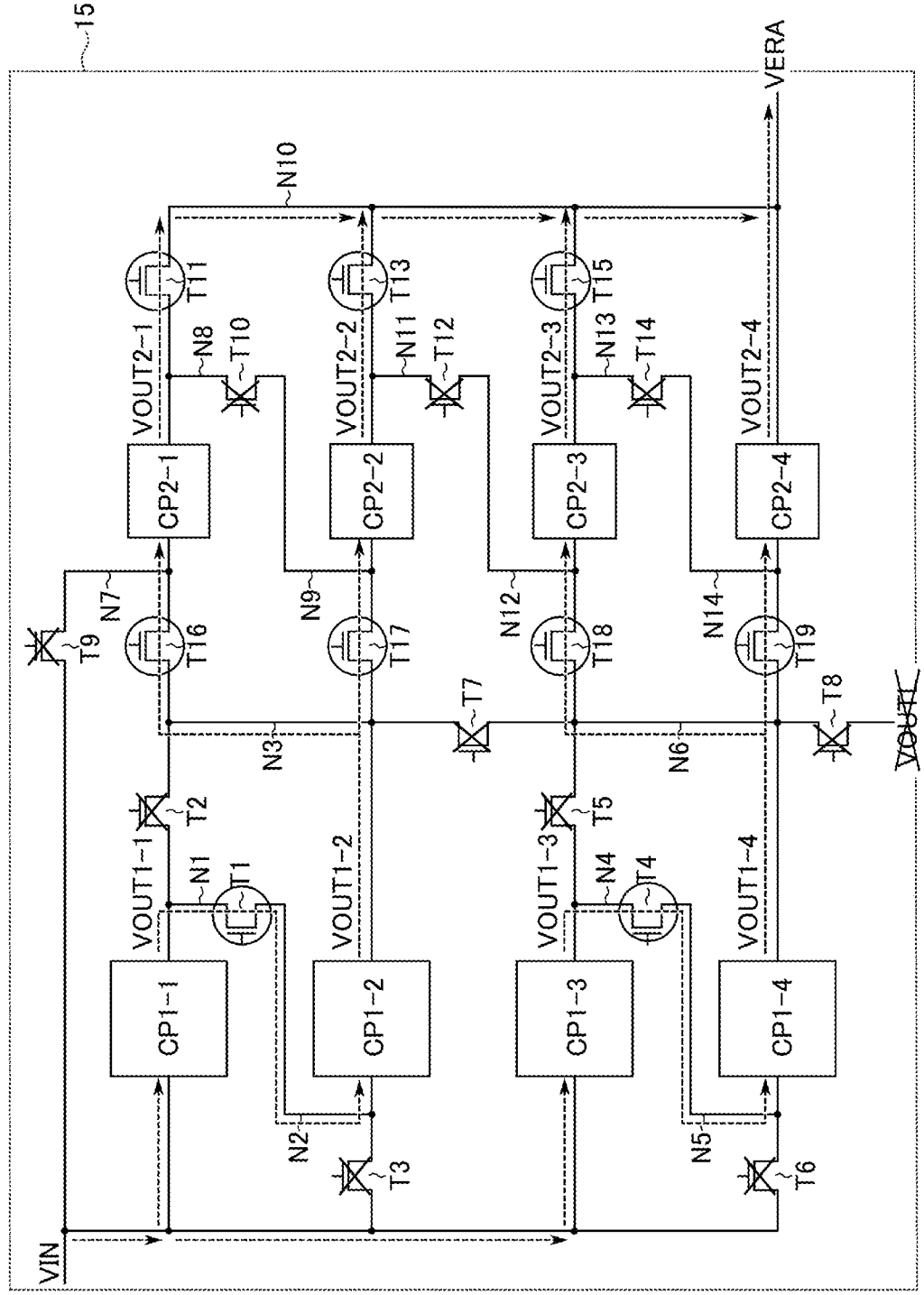
FIG. 9 is a diagram illustrating a combination operation of the voltage generation circuit during the erase voltage applying operation in the erase operation using the semiconductor storage device according to the embodiment.

With reference to FIG. 9, descriptions will be made on the generation of the voltage VERA applied to the source line SL and the bit line BL during the erase voltage applying operation. FIG. 9 is a diagram illustrating a combination operation of the voltage generation circuit 15 during the erase voltage applying operation in the erase operation using the semiconductor storage device 1 according to the embodiment.

In addition, in the following description, the voltages output from the charge pumps CP1-1, CP1-2, CP1-3, and CP1-4, respectively, are referred to as voltages VOUT1-1, VOUT1-2, VOUT1-3, and VOUT1-4, respectively. Further, the voltages output from the charge pumps CP2-1, CP2-2, CP2-3, and CP2-4, respectively, are referred to as voltages VOUT2-1, VOUT2-2, VOUT2-3, and VOUT2-4, respectively.

In the combination operation during the erase voltage applying operation, the sequencer 14 turns on the transistors T1, T4, T11, T13, T15, T16, T17, T18, and T19, and turns off the transistors T2, T3, T5, T6, T7, T8, T9, T10, T12, and T14. In FIG. 9, the transistor that is turned on is marked with the symbol "O", and the transistor that is turned off is marked with the symbol "X".

By the above combination operation, the charge pumps CP1-1 and CP1-2 are connected in series in this order in the voltage generation circuit 15. The charge pumps CP2-1 and CP2-2 are connected in parallel to the output end of the charge pump CP1-2.

Further, the charge pumps CP1-3 and CP1-4 are connected in series in this order. The charge pumps CP2-3 and CP2-4 are connected in parallel to the output end of the charge pump CP1-4.

The output end of each of the charge pumps CP2-1, CP2-2, CP2-3, and CP2-4 is commonly connected.

The voltage VIN is input to the input end of the charge pump CP1-1. The charge pump CP1-1 boosts the input voltage VIN to a voltage VOUT1-1 and outputs the boosted input voltage to the input end of the charge pump CP1-2. The charge pump CP1-2 boosts the input voltage VOUT1-1 to a voltage VOUT1-2 and outputs the boosted input voltage to the input end of each of the charge pumps CP2-1 and CP2-2. The charge pumps CP2-1 and CP2-2 boost the voltage VOUT1-2 input to the input end of each of the charge pumps CP2-1 and CP2-2 to voltages VOUT2-1 and VOUT2-2, respectively, and output the boosted voltages to the node N10.

Further, the voltage VIN is input to the input end of the charge pump CP1-3. The charge pump CP1-3 boosts the input voltage VIN to a voltage VOUT1-3 and outputs the boosted input voltage to the input end of the charge pump CP1-4. The charge pump CP1-4 boosts the input voltage VOUT1-3 to a voltage VOUT1-4 and outputs the boosted input voltage to the input end of each of the charge pumps CP2-3 and CP2-4. The charge pumps CP2-3 and CP2-4 boost the voltage VOUT1-4 input to the input end of each of the charge pumps CP2-3 and CP2-4 to voltages VOUT2-3 and VOUT2-4, respectively, and output the boosted voltage to the node N10. The voltage VERA (VOUTH) is output from the node N10 to the sense amplifier module 17 and the source line driver 18 based on the voltages VOUT2-1, VOUT2-2, VOUT2-3, and VOUT2-4.

With the above, the voltage VERA is supplied to the source line SL and the bit line BL in the block BLK which is the target of the erase operation under the control of the sequencer 14.

1.2.2 Write Operation

Next, brief descriptions will be made on an example of the write operation according to the present embodiment.

The write operation includes a program operation and a write verification operation. The program operation is an operation of raising the threshold voltage by injecting electrons into the charge storage layer (or maintaining the threshold voltage by prohibiting the injection). The write verification operation is an operation of reading data after the program operation and determining whether the threshold voltage of the memory cell transistor MT has reached a target voltage. The semiconductor storage device 1 raises the threshold voltage of the memory cell transistor MT to the target voltage by repeating a combination of the program operation and the write verification operation.

In the following description, the description related to the write verification operation will be omitted, and an example of a case where the program operation is executed once and the voltage supplied by the voltage generation circuit 15 during the program operation will be mainly explained.

1.2.2.1 Program Operation

Figure 10:
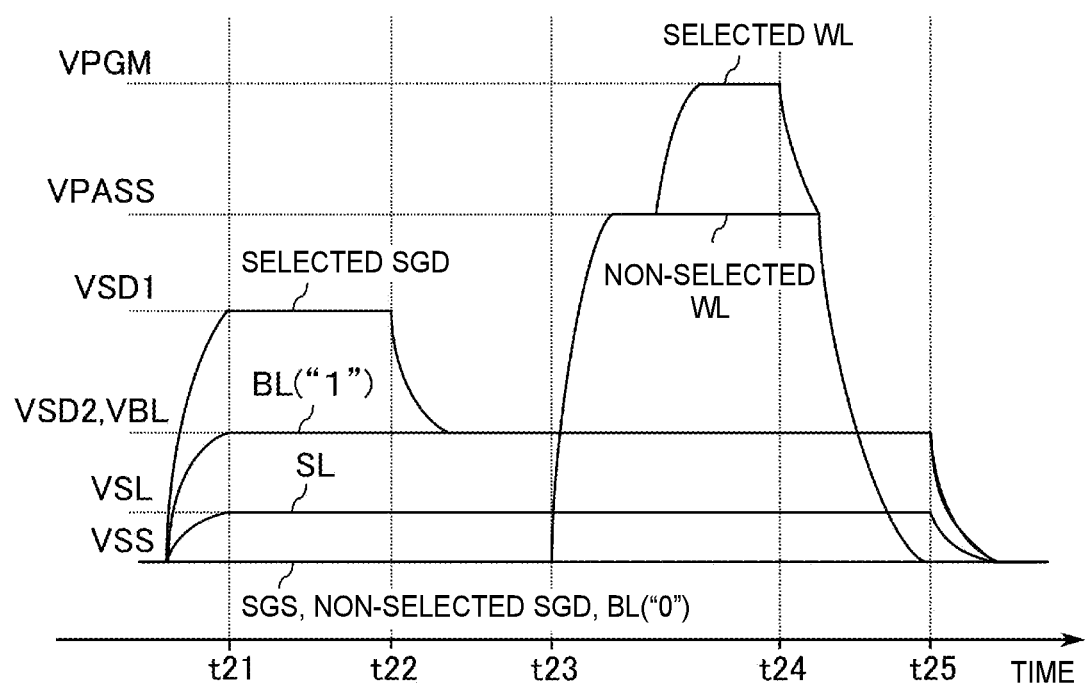
FIG. 10 is a timing chart illustrating an example of voltages of the bit line, the word line, the source line, and the select gate line during a program operation in a write operation using the semiconductor storage device according to the embodiment.

The program operation of the present embodiment will be described with reference to FIG. 10. FIG. 10 is a timing chart illustrating an example of the voltage of each wiring during the program operation using the semiconductor storage device according to the embodiment.

Hereinafter, an operation of raising the threshold voltage of the memory cell transistor MT is referred to as "0" program operation, and an operation of maintaining the threshold voltage of the memory cell transistor MT is referred to as "1" program operation.

As to the voltage of the bit line BL illustrated in the upper part of FIG. 10, the bit line BL ("1") corresponding to the memory cell transistor MT which is a target of the "1" program operation. On the other hand, the bit line BL ("0") corresponding to the memory cell transistor MT which is a target of the "0" program operation.

At time t21, the sense amplifier module 17 applies a voltage VBL to the bit line BL ("1") to perform a BL precharge. Meanwhile, the voltage VSS is applied to the bit line BL ("0").

Further, the row decoder 16 selects any one block BLK from a plurality of blocks BLK, and also selects anyone string unit SU from a plurality of string units SU. Then, the row decoder 16 applies a voltage VSD1 to the select gate line SGD (i.e., the selected SGD in FIG. 10) in the selected string unit SU. Assuming that the threshold voltage of the select transistor ST1 is Vtsg, the voltage VSD1 is a voltage that is equal to or higher than "VBL+Vtsg" and that turns on the select transistor ST1. Meanwhile, the row decoder 16 applies the voltage VSS to the select gate line SGD (non-selected SGD in FIG. 10) of the non-selected string unit SU and turns off the corresponding select transistor ST1. Further, the row decoder 16 applies the voltage VSS to the select gate line SGS and turns off the select transistor ST2.

Further, the source line driver 18 applies a voltage VSL (>VSS) to the source line SL.

At time t22, the row decoder 16 lowers the voltage applied to the select gate line SGD of the selected string unit SU from the voltage VSD1 to a voltage VSD2. For example, the voltage VSD2 is a voltage that is lower than the voltage VSD1, and is equal to or lower than the voltage VBL and turns on the select transistor ST1 in which the voltage VSS is applied to the bit line BL, but turns off the select transistor ST1 in which the voltage VBL is applied to the bit line BL. Thus, the channel of the NAND string NS corresponding to the bit line BL ("1") is in the floating state electrically isolated from the bit line BL and the source line SL.

By changing the voltage of the bit line BL as described above, the "0" program operation and the "1" program operation may be set for each bit line BL in the same program operation.

At time t23, the row decoder 16 selects any one word line WL in the selected block BLK, applies a voltage VPGM to the selected word line WL (selected WL in FIG. 10) while also applying a voltage VPASS to the non-selected word line WL (non-selected WL in FIG. 10).

In the NAND string NS corresponding to the bit line BL ("0"), the select transistor ST1 is turned on. Then, the channel voltage of the memory cell transistor MT connected to the selected word line WL becomes VSS. Accordingly, the voltage difference (VPGM-VSS) between the control gate and the channel becomes larger, and as a result, electrons are injected into the charge storage layer, so that the threshold voltage of the memory cell transistor MT is raised.

In the NAND string NS corresponding to the bit line BL ("1"), the select transistor ST1 is in the cutoff state. Therefore, the channel of the memory cell transistor MT connected to the selected word line WL is in the floating state. Thus, the channel voltage rises by the capacitive coupling of the channel and the word line WL. Accordingly, the voltage difference between the control gate and the channel becomes smaller, and as a result, electrons are hardly injected into the charge storage layer, so that the threshold voltage of the memory cell transistor MT is maintained.

At time t24, the row decoder 16 applies the voltage VSS to the selected word line WL and the non-selected word line WL. Thus, the injection of charges into the charge storage layer is terminated.

At time t25, the row decoder 16 applies the voltage VSS to the select gate line SGD.

Further, the sense amplifier module 17 applies the voltage VSS to the bit line BL.

Further, the source line driver 18 applies the voltage VSS to the source line SL.

With the above, the program operation is terminated.

In addition, FIG. 10 is merely an example of the timing chart of the program operation according to the present embodiment, and a magnitude relationship of the voltages applied to each of the bit line BL, the word line WL, the source line SL, and the select gate lines SGS and SGD does not necessarily correspond to a magnitude relationship of the voltages illustrated in FIG. 10. For example, in FIG. 10, the voltages VBL and VSD2 are illustrated as equivalent voltages, but the voltages VBL and VSD2 may be different from each other.

1.2.2.2 Combinant Operation in Program Operation

Figure 11:
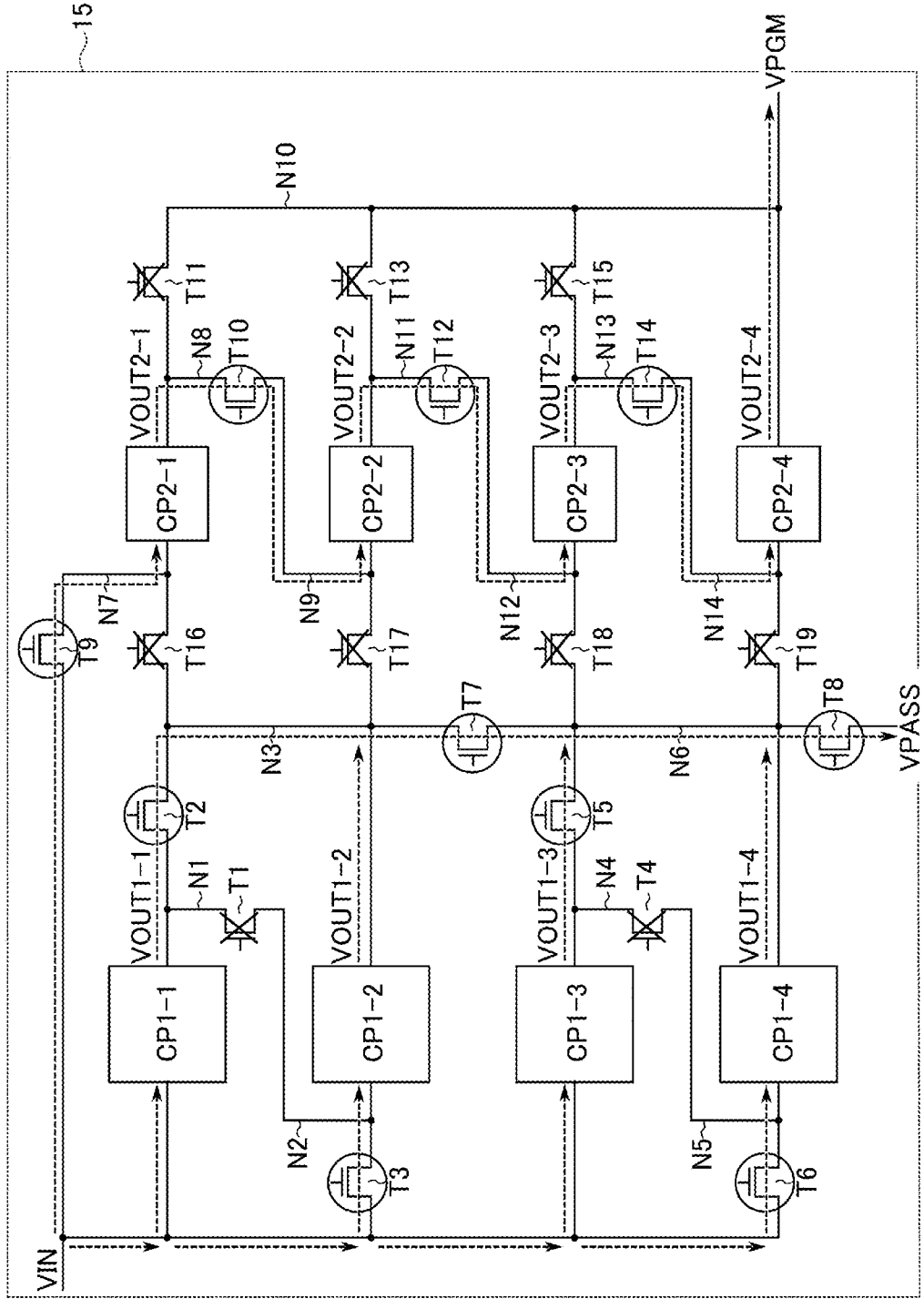
FIG. 11 is a diagram illustrating a combination operation of the voltage generation circuit during the program operation in the write operation using the semiconductor storage device according to the embodiment.

The generation of the voltages VPASS and VPGM applied to the word line WL during the program operation will be described with reference to FIG. 11. FIG. 11 is a diagram illustrating a combination operation of the voltage generation circuit 15 during the program operation in the write operation using the semiconductor storage device 1 according to the embodiment.

In the combination operation during the program operation, the sequencer 14 turns on the transistors T2, T3, T5, T6, T7, T8, T9, T10, T12, and T14, and turns off the transistors T1, T4, T11, T13, T15, T16, T17, T18, and T19. In FIG. 11, the transistor that is turned on is marked with the symbol "O", and the transistor that is turned off is marked with the symbol "X".

By the above combination operation, the charge pumps CP1-1, CP1-2, CP1-3, and CP1-4 are connected in parallel in the voltage generation circuit 15. The output end of each of the charge pumps CP1-1, CP1-2, CP1-3, and CP1-4 is commonly connected.

Further, in the voltage generation circuit 15, the charge pumps CP2-1, CP2-2, CP2-3, and CP2-4 are connected in series in this order.

The voltage VIN is input to the input end of each of the charge pumps CP1-1 to CP1-4. The charge pumps CP1-1 to CP1-4 boost the input voltage VIN to voltages VOUT1-1 to VOUT1-4, respectively, and output the boosted input voltage to the first end of the transistor T8. The voltage VPASS (VOUTL) is supplied from the second end of the transistor T8 to the row decoder 16 based on the voltages VOUT1-1 to VOUT1-4.

Further, the voltage VIN is input to the input end of the charge pump CP2-1 via the transistor T9. The charge pump CP2-1 boosts the input voltage VIN to a voltage VOUT2-1 and outputs the boosted input voltage to the input end of the charge pump CP2-2. The charge pump CP2-2 boosts the input voltage VOUT2-1 to a voltage VOUT2-2 and outputs the boosted input voltage to the input end of the charge pump CP2-3. The charge pump CP2-3 boosts the input voltage VOUT2-2 to a voltage VOUT2-3 and outputs the boosted input voltage to the input end of the charge pump CP2-4. The charge pump CP2-4 boosts the input voltage VOUT2-3 to a voltage VPGM(VOUTH) and outputs the boosted input voltage to the row decoder 16.

With the above, under the control of the sequencer 14, the voltage VPGM is supplied to the selected word line WL, and the voltage VPASS is supplied to the non-selected word line WL.

1.2.3 Read Operation

First, an example of the read operation according to the present embodiment will be described. In addition, in the following description, in order to simplify the description, a case where 1-bit data is read in one read operation will be described.

1.2.3.1 Voltage of Each Wiring during Read Operation

Figure 12:
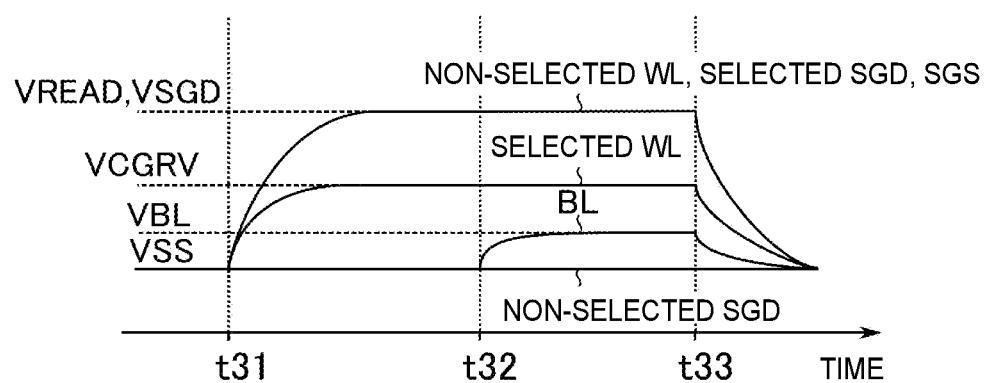
FIG. 12 is a timing chart illustrating an example of voltages of the bit line, the word line, and the select gate line during a read operation using the semiconductor storage device according to the embodiment.

The voltage of each wiring during the read operation will be described with reference to FIG. 12. FIG. 12 is a timing chart illustrating an example of the voltage of each wiring during the read operation.

At time t31, the row decoder 16 applies a voltage VSGD to the select gate line SGD (i.e., the selected SGD in FIG. 12) corresponding to the selected string unit SU. Further, the row decoder 16 applies the voltage VSS to the select gate line SGD (i.e., the non-selected SGD in FIG. 12) corresponding to the non-selected string unit SU. Further, the row decoder 16 applies, for example, a voltage equivalent to the voltage VSGD to the select gate line SGS. The voltage VSGD is a voltage that is applied to the select gate lines SGD and SGS during the read operation and turns on the corresponding select transistors ST1 and ST2. Thus, the select transistor ST1 and the select transistor ST2 of the selected string unit SU are turned on, and the select transistor ST1 of the non-selected string unit SU is turned off.

Further, the row decoder 16 applies the voltage VREAD to the non-selected word line WL (i.e., the non-selected WL in FIG. 12) and applies a voltage VCGRV to the selected word line WL (i.e., the selected WL in FIG. 12). The voltage VREAD is a voltage higher than the voltage VCGRV (VREAD>VCGRV). The voltage VREAD is a voltage that is applied to the non-selected word line WL during the read operation and turns on the corresponding memory cell transistor MT. The voltage VCGRV is a voltage depending on the threshold voltage of the memory cell transistor MT which is a target of the read operation. More specifically, for example, when the threshold voltage of the memory cell transistor MT which is the target of the read operation is higher than the voltage VCGRV, the memory cell transistor MT is turned off, and when the threshold voltage is equal to or less than the voltage VCGRV, the memory cell transistor MT is turned on.

At time t32, the sense amplifier module 17 sets the voltage of the bit line BL to the voltage VBL. The voltage VBL is, for example, a voltage lower than the voltage VCGRV (VCGRV>VBL).

At time t33, the row decoder 16 applies the voltage VSS to the selected word line WL and the non-selected word line WL, and the select gate line SGD and the select gate line SGS corresponding to the selected string unit SU and the non-selected string unit SU.

Further, the sense amplifier module 17 applies the voltage VSS to the bit line BL.

With the above operation, data is read from the memory cell transistor MT corresponding to the selected word line WL of the selected string unit SU.

In addition, FIG. 12 is merely an example of the timing chart of the read operation according to the present embodiment, and a magnitude relationship of the voltages applied to each of the bit line BL, the word line WL, the source line SL, and the select gate line SGD does not necessarily correspond to a magnitude relationship of the voltages illustrated in FIG. 12. For example, in FIG. 12, the voltages VREAD and VSGD are illustrated as equivalent voltages. Alternatively, the voltages VREAD and VSGD may be different from each other.

1.2.3.2 Generation of Voltage Applied to Word Line During Read Operation

Figure 13:
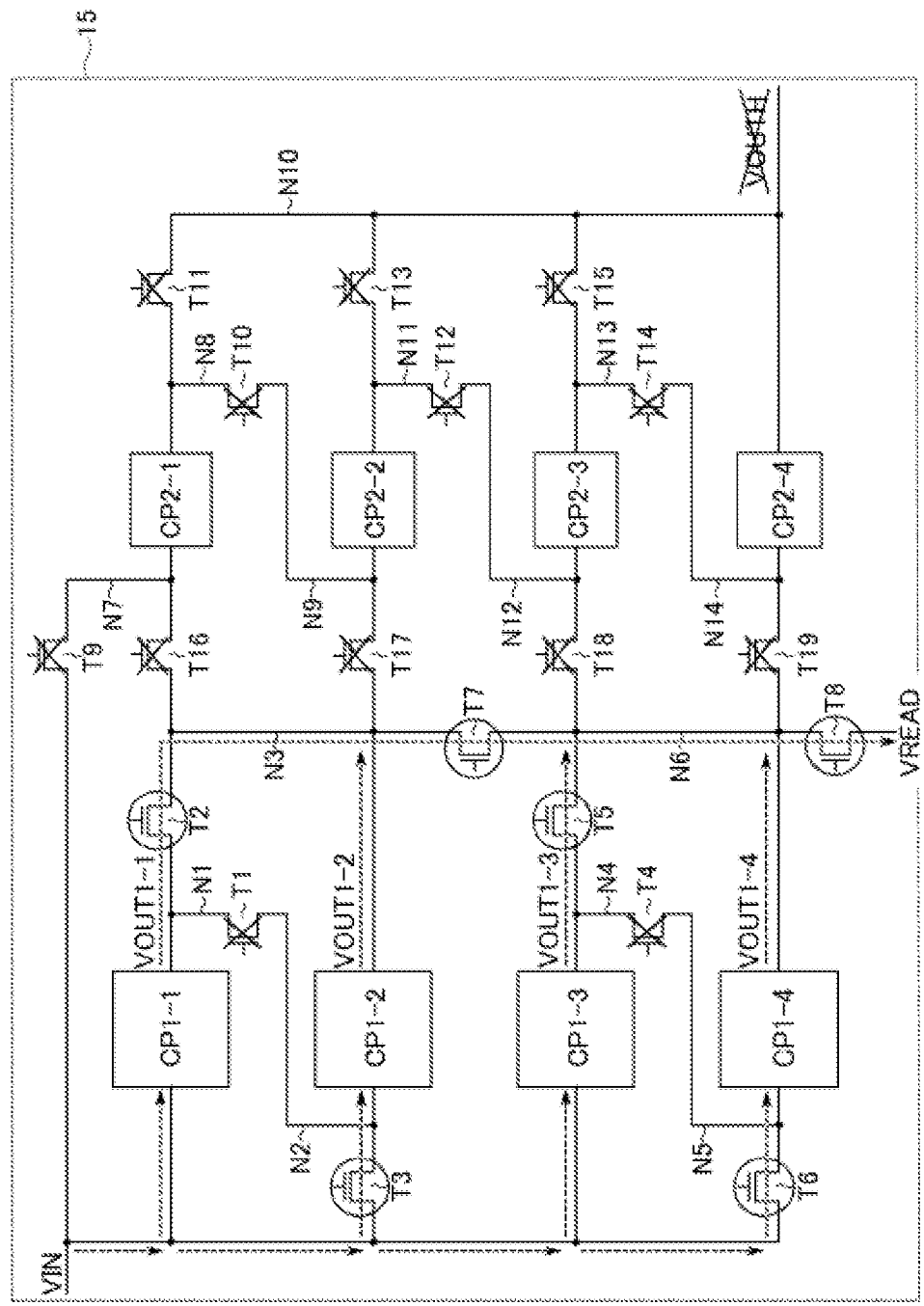
FIG. 13 is a diagram illustrating a combination operation of the voltage generation circuit during the read operation using the semiconductor storage device according to the embodiment.

The generation of the voltage VREAD applied to the word line WL during the read operation will be described with reference to FIG. 13. FIG. 13 is a diagram illustrating the generation of the voltage VREAD by the voltage generation circuit 15 during the read operation using the semiconductor storage device 1 according to the embodiment.

In the combination operation during the read operation, the sequencer 14 turns on the transistors T2, T3, T5, T6, T7, and T8, and turns off the transistors T1, T4, and T9 to T19. In FIG. 13, the transistor that is turned on is marked with the symbol "O", and the transistor that is turned off is marked with the symbol "X".

By the above combination operation, the charge pumps CP1-1, CP1-2, CP1-3, and CP1-4 are connected in parallel in the voltage generation circuit 15. The output end of each of the charge pumps CP1-1, CP1-2, CP1-3, and CP1-4 is commonly connected.

Further, the charge pumps CP2-1 to CP2-4 are electrically isolated from the charge pump CP1 and a voltage source that supplies the voltage VIN.

The voltage VIN is input to the input end of each of the charge pumps CP1-1 to CP1-4. Each of the charge pumps CP1-1 to CP1-4 boosts the input voltage VIN to voltages VOUT1-1 to VOUT1-4, respectively, and output the boosted input voltage to the first end of the transistor T8. The voltage VREAD (VOUTL) is output from the second end of the transistor T8 to the row decoder 16 based on the voltages VOUT1-1 to VOUT1-4.

In addition, the voltage VOUTH is not output from the node N10 during the read operation.

As described above, the voltage VREAD is supplied to the non-selected word line WL under the control of the sequencer 14.

1.3 Effects

According to the present embodiment, it is possible to prevent an increase in the area of the voltage generation circuit 15 and an increase in the amount of current consumed by the voltage generation circuit 15. The effects of the embodiment will be described below.

The voltage generation circuit 15 is configured to electrically disconnect between the charge pump CP1 and the charge pump CP2 during the read operation and the write operation. Specifically, the charge pump CP1 is mainly used to generate the voltages VREAD and VPASS supplied to n−1 non-selected word lines WL among n (e.g., 8, 16, 32, 48, 64, 96, or 128) word lines in the block BLK. Further, the charge pump CP2 is mainly used to generate the voltage VPGM supplied to one selected word line WL. This enables efficient voltage generation.

In addition, the charge pump CP1 has a lower boost gain in a high voltage region than the charge pump CP2 by the voltage drop due to the threshold voltage of each transistor CT, but has a high current supply capacity in a low voltage region. Therefore, it is advantageous to generate a voltage that is a relatively low voltage but has a large capacitive load of a charge target, such as the voltages VREAD and VPASS. Meanwhile, since the charge pump CP2 has a more complicated configuration than the charge pump CP1 and thus, has a lower current supply capacity than the charge pump CP1. However, the influence of the voltage drop due to the threshold voltage of each transistor VtT may be substantially ignored, the charge pump CP2 has a higher boost gain than the charge pump CP1 in a high voltage region. Therefore, it is advantageous to generate a voltage that is a relatively high voltage but has a small capacitive load of a charge target, such as the voltage VPGM.

According to the present embodiment, the voltage generation circuit 15 uses the charge pump CP1 and the charge pump CP2 properly in the read operation and the write operation in order to generate a voltage suitable for each characteristic. Thus, it is possible to prevent an increase in the amount of current consumed by the voltage generation circuit 15 and the circuit area.

Further, the voltage generation circuit 15 is configured to electrically connect between the output end of the charge pump CP1 and the input end of the charge pump CP2 during the erase operation. Specifically, the voltage generation circuit 15 generates the voltage VERA by using the charge pump CP1 for boosting in a low voltage region and the charge pump CP2 for boosting in a high voltage region during the erase operation while also combining the charge pumps. Thus, by connecting the charge pump CP1 and the charge pump CP2 in series, it is possible to obtain a high current supply capacity of the charge pump CP1 in a high voltage region (when generating the voltage VERA). Therefore, it is possible to supply the voltage VERA which is a high voltage and has a large capacitive load of a charge target. Further, the charge pump CP1 and the charge pump CP2 used for the write operation and the read operation may be diverted. Therefore, it is possible to avoid a decrease in boost gain that may occur when the charge pump CP1 is used for boosting in a high voltage region. Accordingly, it is possible to prevent an increase in the amount of current consumed by the voltage generation circuit 15 and the circuit area.

Further, the voltage generation circuit 15 commonly connects the input end of each of the charge pumps CP2-1 and CP2-2 to the output end of the charge pump CP1-2 during the erase operation. Further, the voltage generation circuit 15 commonly connects the input end of each of the charge pumps CP2-3 and CP2-4 to the output end of the charge pump CP1-4 during the erase operation. In this way, by connecting the input ends of the two charge pumps CP2 in parallel to the output end of one charge pump CP1, it is possible to obtain a current supply capacity higher than that when one charge pump CP2 is connected to the output end of the charge pump CP1 (it is possible to supplement the low current supply capacity of the charge pump CP2).

2. Others

In addition, the configurations of the charge pump CP1 and the charge pump CP2 are not limited to the example described in the embodiment. For example, for the charge pump CP1, a charge pump having a higher current supply capacity than that of the charge pump CP2 may be used. Further, for the charge pump CP2, for example, a charge pump having a boost gain that does not change significantly when outputting a voltage equal to or lower than the voltage VERA may be used.

More specifically, the charge pump CP1 may include a transistor having a three-layered structure including, for example, a P-type substrate, an N-type layer embedded in the substrate, and a P-type well formed in the embedded layer.

When the transistor having a three-layered structure is used for boosting in a high voltage region, the thickness of the substrate may be increased, for example, in order to prevent the generation of leakage current flowing from the N-type embedded layer to the outside of the substrate. However, an increase in the thickness of the substrate is not desirable because of a limitation by the semiconductor storage device 1 accompanied by an improvement in storage capacity.

According to the present embodiment, the charge pump CP1 may be used for boosting in a low voltage region in the erase operation. Therefore, the generation of leakage current may be substantially ignored, and an increase in the thickness of the substrate may be prevented. Further, since the transistor having the three-layered structure reduces the influence of the voltage of the substrate on the voltage drop due to the threshold voltage of the transistor, a decrease in the boost gain of the charge pump CP1 is prevented.

Further, the charge pump CP1 and the charge pump CP2 in the embodiment may be provided respectively in physically different regions within the voltage generation circuit 15.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor storage device comprising:
a memory cell array; and
a voltage generation circuit configured to supply voltages of different levels to the memory cell array, the voltage generation circuit including a first charge pump having a first characteristic and a second charge pump having a second characteristic that is substantially different from the first characteristic, each charge pump having an input end and an output end,
wherein the voltage generation circuit is controlled to electrically disconnect the output end of the first charge pump and the input end of the second charge pump in a first operation during which a first voltage is supplied to the memory cell array, and to electrically connect the output end of the first charge pump and the input end of the second charge pump in a second operation during which a second voltage that is higher than the first voltage is supplied to the memory cell array.

2. The semiconductor storage device according to claim 1, wherein
the first charge pump having the first characteristic generates a first current amount from the output end thereof, and
the second charge pump having the second characteristic generates a second current amount that is smaller than the first current amount from the output end thereof.

3. The semiconductor storage device according to claim 1, wherein the first charge pump having the first characteristic has a lower boost gain than the second charge pump having the second characteristic when the output ends of the first charge pump and the second charge pump are at the same voltage level, the boost gain for a charge pump being defined as a ratio of a voltage generated at an output end thereof to a voltage supplied to an input end thereof.

4. The semiconductor storage device according to claim 1, wherein the first charge pump having the first characteristic generates a third voltage from a maximum allowed input voltage, and the third voltage is lower than the second voltage.

5. The semiconductor storage device according to claim 1, wherein
in the first operation, the first voltage is supplied to a first memory cell of the memory cell array using the first charge pump.

6. The semiconductor storage device according to claim 5, wherein
in the first operation, a third voltage higher than the first voltage is supplied to a second memory cell of the memory cell array using the second charge pump.

7. The semiconductor storage device according to claim 5, wherein
in the second operation, the second voltage is supplied to a bit line of the memory cell array and a source line of the memory cell array.

8. The semiconductor storage device according to claim 1, wherein
the voltage generation circuit further includes a third charge pump having an input end and an output end, and
in the second operation, the input end of the second charge pump and the input end of the third charge pump are both electrically connected to the output end of the first charge pump.

9. The semiconductor storage device according to claim 8, wherein the third charge pump has the second characteristic.

10. The semiconductor storage device according to claim 9, wherein the first charge pump is provided in a first region of the voltage generation circuit, and the second charge pump and the third charge pump are provided in a second region of the voltage generation circuit.

11. A semiconductor storage device comprising:
a memory cell array;
a voltage generation circuit including first and second charge pumps of a first type and third and fourth charge pumps of a second type; and
a control circuit configured to control transistors in the voltage generation circuit for the voltage generation circuit to generate a first voltage using the first and second charge pumps for a first operation performed on the memory cell array, a second voltage using the first and second charge pumps and a third voltage higher than each of the first and second voltage using the third and fourth charge pumps for a second operation performed on the memory cell array, and a fourth voltage higher than the third voltage using the first, second, third, and fourth pumps for a third operation performed on the memory cell array.

12. The semiconductor storage device according to claim 11, wherein the first operation is a read operation, the second operation a program operation, and the third operation an erase voltage applying operation.

13. The semiconductor storage device according to claim 12, wherein
the memory cell array includes a first memory cell having a gate connected to a first word line, and a second memory cell having a gate connected to a second word line, and
during the read operation, a read voltage lower than the first voltage is applied to the first word line and the first voltage is applied to the second word line.

14. The semiconductor storage device according to claim 12, wherein
the memory cell array includes a first memory cell having a gate connected to a first word line, and a second memory cell having a gate connected to a second word line, and
during the program operation, the third voltage is applied to the first word line and the second voltage is applied to the second word line.

15. The semiconductor storage device according to claim 12, wherein
the memory cell array includes a plurality of memory cells electrically connected in series between a bit line and a source line, and
during the erase voltage applying operation, the fourth voltage is applied to the bit line and the source line.

16. A method of generating voltages to be applied to a memory cell array of a semiconductor storage device during operations performed on the memory cell array, wherein the semiconductor storage device includes first and second charge pumps of a first type and third and fourth charge pumps of a second type, said method comprising:
generating a first voltage using the first and second charge pumps for a first operation performed on the memory cell array;
generating a second voltage using the first and second charge pumps and a third voltage higher than each of the first and second voltage using the third and fourth charge pumps for a second operation performed on the memory cell array; and
generating a fourth voltage higher than the third voltage using the first, second, third, and fourth pumps for a third operation performed on the memory cell array.

17. The method according to claim 16, wherein the first operation is a read operation, the second operation a program operation, and the third operation an erase voltage applying operation.

18. The method according to claim 17, wherein
the memory cell array includes a first memory cell having a gate connected to a first word line, and a second memory cell having a gate connected to a second word line, and
during the read operation, a read voltage lower than the first voltage is applied to the first word line and the first voltage is applied to the second word line.

19. The method according to claim 17, wherein
the memory cell array includes a first memory cell having a gate connected to a first word line, and a second memory cell having a gate connected to a second word line, and
during the program operation, the third voltage is applied to the first word line and the second voltage is applied to the second word line.

20. The method according to claim 17, wherein
the memory cell array includes a plurality of memory cells electrically connected in series between a bit line and a source line, and
during the erase voltage applying operation, the fourth voltage is applied to the bit line and the source line.

* * * * *